United States Patent
Sugahara et al.

(10) Patent No.: US 7,565,723 B2
(45) Date of Patent: Jul. 28, 2009

(54) PIEZOELECTRIC ACTUATOR AND METHOD OF FABRICATING PIEZOELECTRIC ACTUATOR

(75) Inventors: Hiroto Sugahara, Ama-gun (JP); Kazuo Kobayashi, Kakamigahara (JP); Motohiro Yasui, Nagoya (JP); Jun Akedo, Tsukuba (JP); Sou Baba, Tsukuba (JP)

(73) Assignees: Brother Kogyo Kabushik Kaisha, Nagoya (JP); National Institute of Advanced Industrial Science and Technology, Tokyo (JP)

( * ) Notice: Subject to any disclaimer, the term of this patent is extended or adjusted under 35 U.S.C. 154(b) by 449 days.

(21) Appl. No.: 11/083,953

(22) Filed: Mar. 21, 2005

(65) Prior Publication Data
US 2005/0231073 A1  Oct. 20, 2005

(30) Foreign Application Priority Data
Mar. 30, 2004  (JP)  ............................. 2004-100239

(51) Int. Cl.
H01L 41/22  (2006.01)
(52) U.S. Cl. .................. 29/25.35; 29/890.1; 29/594; 29/595; 29/832; 29/831; 310/328
(58) Field of Classification Search ............... 29/25.35, 29/890.1, 594, 595, 609.1, 832, 831; 347/68–71, 347/45, 47, 48; 310/328, 311, 313 A; 156/295; 427/100, 475, 509, 517, 374.6, 376.3
See application file for complete search history.

(56) References Cited

U.S. PATENT DOCUMENTS

| 5,297,553 | A | * | 3/1994 | Sliwa et al. ................. 600/459 |
| 5,454,146 | A | * | 10/1995 | Yagi et al. .................. 29/25.35 |
| 5,677,717 | A | * | 10/1997 | Ohashi ......................... 347/69 |
| 6,297,579 | B1 | * | 10/2001 | Martin et al. ................ 310/330 |
| 6,328,432 | B1 | * | 12/2001 | Oota ............................. 347/68 |
| 6,419,848 | B1 | * | 7/2002 | Qiu et al. ................. 252/62.9 R |
| 6,531,187 | B2 | * | 3/2003 | Akedo ........................ 427/475 |
| 6,607,259 | B2 | * | 8/2003 | Mott et al. .................... 347/18 |

FOREIGN PATENT DOCUMENTS

| JP | A 11-70653 | 3/1999 |
| JP | A 11-70654 | 3/1999 |
| JP | 2001-152361 | * 6/2001 |

* cited by examiner

*Primary Examiner*—David P Bryant
*Assistant Examiner*—Tai Nguyen
(74) *Attorney, Agent, or Firm*—Oliff & Berridge, PLC

(57) ABSTRACT

A piezoelectric material layer is easily formed on a partial region of the substrate surface. By forming a different hardness material layer that has a different hardness from that of the substrate in the form of a pattern on the surface of the substrate, a film-deposition permitting region A to which particles of a piezoelectric material in a carrier gas adhere in a form of a film and a film-deposition inhibiting region B which inhibits the formation of a film are provided. Further, when a carrier gas containing particles of a piezoelectric material are ejected onto the surface of the substrate by means of AD, a film-like piezoelectric material layer is formed as a result of the adhesion of the particles in the film-deposition permitting region A. As a result, the piezoelectric material layer can be formed easily in a partial region of the surface of the substrate.

27 Claims, 10 Drawing Sheets

PIEZOELECTRIC ACTUATOR AND METHOD OF FABRICATING PIEZOELECTRIC ACTUATOR

BACKGROUND OF THE INVENTION

1. Field of the Invention

The present invention relates to a piezoelectric actuator that is fabricated by using so-called aerosol deposition (AD) that performs film deposition by mixing a raw material with a gas and ejecting the mixture from a nozzle so that the same collides with a substrate, and to an inkjet head and fabrication methods thereof.

2. Description of the Related Art

As an example of a piezoelectric actuator that is used in an inkjet head or the like, there is a piezoelectric actuator that comprises an ink flow path formation member in which a plurality of pressure chambers is formed, wherein a substrate that constitutes a portion of the wall surface of each of the pressure chambers is bent by means of a piezoelectric material layer that is provided on the substrate so that ink in the pressure chambers is ejected out from a nozzle that communicates with the pressure chamber (See Japanese Patent Application Laid Open No. H11-70653), for example). In such a piezoelectric actuator, in cases where the piezoelectric material layer is provided over the whole area of the substrate surface, the piezoelectric material layer is bent locally by individually arranging one electrode (individual electrode) in a position that corresponds with each pressure chamber on the surface of the piezoelectric material layer and applying an electric field between the electrode and a conductive substrate that is used as a common electrode. However, in this case, vibrations are transmitted to the periphery of the bent part of the piezoelectric material layer and, as a result, there is a variation in the ejection speed and volume, and so forth when the ink is ejected from an adjacent pressure chamber. Based on a situation where such so-called crosstalk and so forth is to be prevented, the piezoelectric material layer is not provided over the whole area of the substrate surface and it is desirable to provide the piezoelectric material layer only in a partial region that corresponds to the pressure chamber.

As means for forming the piezoelectric material layer only in a partial region, a method that forms a resist with a predetermined pattern on the substrate surface, forms a piezoelectric material layer by means of aerosol deposition (AD) over the whole area of the upper surface, removes the resist and then leaves behind a piezoelectric material layer on the substrate in the form of a pattern may be considered, for example. However, with this method, there has been the problem that, when the resist is removed, the piezoelectric material layer is split and there is the risk that chips, cracks, and so forth will be produced in the piezoelectric material layer on the substrate.

SUMMARY OF THE INVENTION

The present invention was completed based on the situation above and an object thereof is to provide a piezoelectric actuator that makes it possible to form a piezoelectric material layer in a partial region of the substrate surface in a straightforward manner, as well as an inkjet head and fabrication methods thereof.

As means for achieving the above object, the first mode of the present invention provides a piezoelectric actuator fabrication method in which a piezoelectric material layer is formed by ejecting a carrier gas containing particles of a piezoelectric material onto a substrate surface to cause the particles to adhere to the substrate surface, comprising the steps of pre-providing, on the substrate surface, a film-deposition permitting region to which particles of the piezoelectric material in the carrier gas adhere in a form of a film and a film-deposition inhibiting region which inhibits the adhesion of the particles in a form of a film thereto; and, subsequently, forming the piezoelectric material layer on the film-deposition permitting region by ejecting the carrier gas containing the particles onto the substrate surface.

Further, according to the present invention, 'the adhesion of the particles and the formation of a film are inhibited' may be a condition according to which it is difficult for the particles to adhere to form a film to the film-deposition inhibiting region in comparison with the film-deposition permitting region and includes cases where, when a carrier gas is ejected, a very thinner film (a thin film that is thin enough to allow straightforward removal by means of a subsequent thermal processing or peeling step or the like) is formed on the film-deposition inhibiting region in comparison with the film formed in the film-deposition permitting region.

The second mode of the present invention provides a piezoelectric actuator fabrication method in which a piezoelectric material layer is formed by ejecting a carrier gas containing particles of a piezoelectric material onto one surface of a substrate to cause the particles to adhere to the one surface of the substrate, comprising a film deposition region formation step of providing, on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and a piezoelectric layer formation step of forming the piezoelectric material layer on the film-deposition permitting region by ejecting the carrier gas containing the particles onto the one surface of the substrate that has undergone the film deposition region formation step.

The third mode of the present invention is constituted such that, in the piezoelectric actuator fabrication method according to the second mode of the present invention, in the film deposition region formation step, the film-deposition permitting region and the film-deposition inhibiting region are made different by changing the mutual surface hardness.

The fourth mode of present invention is constituted such that, in the piezoelectric actuator fabrication method according to the third mode of the present invention, the value of the ratio between the Vickers hardness Hv (b) of the film-deposition permitting region and the Vickers hardness Hv (p) of the particles is in the range $0.39 \leq Hv(p)/Hv(b) \leq 3.08$ and the ratio between the Vickers hardness Hv (b) of the film-deposition inhibiting region and the Vickers hardness Hv (p) of the particles is a value less than 0.39 or exceeding 3.08.

The fifth mode of the present invention is constituted such that, in the piezoelectric actuator fabrication method according to the third mode of the present invention 3, the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.39 or more than 3.08.

The sixth mode of the present invention is constituted such that, in the piezoelectric actuator fabrication method according to the third mode of the present invention 3, the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.43 or exceeding 1.43.

According to the present invention, because a film is also deposited on the film-deposition inhibiting region that is thinner than that deposited in the film-deposition permitting region, it is desirable to provide a step of removing the thin film that is formed on the film-deposition inhibiting region following the piezoelectric layer formation step.

The seventh mode of the present invention is constituted such that, in the piezoelectric actuator fabrication method according to the third mode of the present invention, in the film deposition region formation step, by forming a different hardness material layer with a different surface hardness from that of the substrate on the one surface of the substrate by means of patterning, the film-deposition permitting region constituted by an exposed region of the one surface of the substrate and the film-deposition inhibiting region constituted by the different hardness material layer are provided.

The eighth mode of the present invention is constituted such that, in the piezoelectric actuator fabrication method according to the seventh mode of the present invention, the different hardness material layer possesses an insulating property.

The ninth mode of the present invention is the piezoelectric actuator fabrication method according to the second mode of the present invention, further comprising, following the piezoelectric layer formation step, an electrode formation step of forming an individual electrode for applying an electric field to the piezoelectric material layer on the piezoelectric material layer.

The tenth mode of the present invention is the piezoelectric actuator fabrication method according to the eighth mode of the present invention, further comprising, following the piezoelectric layer formation step, an electrode formation step of forming an individual electrode for applying an electric field to the piezoelectric material layer on the piezoelectric material layer, wherein, in the electrode formation step, a lead portion that is electrically connected to the individual electrode is formed on the different hardness material layer.

The eleventh mode of the present invention is constituted such that, in the piezoelectric actuator fabrication method according to the second mode of the present invention, in the film deposition region formation step, by performing surface processing to adjust the surface roughness of the one surface of the substrate, a region of low surface-roughness constituting the film-deposition permitting region and a region of high surface-roughness constituting the film-deposition inhibiting region are provided.

The twelfth mode of the present invention is constituted such that, in the piezoelectric actuator fabrication method according to the second mode of the present invention, in the film deposition region formation step, a buffer fluid layer for inhibiting the adhesion of the particles in the form of a film by reducing the collision speed of the particles in the piezoelectric material in the carrier gas, is provided, constituting the film-deposition inhibiting region on the one surface of the substrate.

The thirteenth mode of the present invention is constituted such that, in the piezoelectric actuator fabrication method according to the twelfth mode of the present invention, the buffer fluid layer comprises a fluid that is nonvolatile.

The fourteenth invention of the present invention is constituted such that, in the piezoelectric actuator fabrication method according to the second mode of the present invention, the substrate is made of a material that possesses conductivity and is used as one electrode for applying an electric field to the piezoelectric material layer.

The fifteenth mode of the present invention is a fabrication method for an inkjet head that comprises an ink flow path formation member, which includes a common ink chamber and a plurality of ink flow paths, each extending from the common ink chamber to a nozzle via a pressure chamber, and an actuator unit that changes the capacity of the pressure chamber, comprising a flow path formation member creation step of creating an ink flow path formation member in which a portion of the pressure chamber is open; a substrate fixation step of fixing a conductive substrate constituting a common electrode of the actuator unit to the ink flow path formation member to close the pressure chamber; a film deposition region formation step of providing, on a surface of the conductive substrate opposite from a surface fixed to the ink flow path formation member, a film-deposition permitting region to which, when a carrier gas containing particles of a piezoelectric material is ejected onto the surface of the conductive substrate opposite from the surface fixed to the ink flow path formation member, the particles adhere until a film is formed and a film-deposition inhibiting region which inhibits the adhesion of the particles in a form of a film; a piezoelectric layer formation step of forming the piezoelectric material layer constituting an active layer of the actuator unit on the film-deposition permitting region by ejecting the carrier gas containing the particles; and an electrode formation step of forming an individual electrode of the actuator unit on the piezoelectric material layer.

The sixteenth mode of the present invention is a piezoelectric actuator in which a piezoelectric material layer is formed by ejecting a carrier gas containing particles of a piezoelectric material onto one surface of a substrate to cause the particles to adhere to the one surface of the substrate, wherein a film-deposition permitting region to which particles of the piezoelectric material in the carrier gas adhere in a form of a film and a film-deposition inhibiting region which inhibits the adhesion of the particles in a form of a film are provided on one surface of the substrate; and the piezoelectric material layer is formed on the film-deposition permitting region.

The seventeenth mode of the present invention is constituted such that, in the piezoelectric actuator fabrication method according to the sixteenth mode of the present invention, the film-deposition permitting region and the film-deposition inhibiting region are made different by forming a different hardness material layer that possesses a different surface hardness from that of the substrate on one surface of the substrate.

The eighteenth mode of the present is constituted such that, in the piezoelectric actuator fabrication method according to the seventeenth mode of the present invention, the film-deposition inhibiting region is constituted by the different hardness material layer that is harder than the substrate.

The nineteenth mode of the present invention is constituted such that, in the piezoelectric actuator fabrication method according to the sixteenth mode of the present invention, an individual electrode for applying an electric field to the piezoelectric material layer is formed on the piezoelectric material layer.

The twentieth mode of the present invention is constituted such that, in the piezoelectric actuator fabrication method according to the eighteenth mode of the present invention, the different hardness material layer possesses insulating properties and a lead portion that is connected electrically to the individual electrode is formed on the different hardness material layer.

The twenty-first mode of the present invention is constituted such that, in the piezoelectric actuator fabrication method according to the sixteenth mode of the present invention, the film-deposition inhibiting region is made different from the film-deposition permitting region by increasing the surface roughness of the substrate in comparison with that of the film-deposition permitting region.

The twenty-second mode of the present invention is constituted such that, in the piezoelectric actuator fabrication method according to the sixteenth mode of the present invention, the substrate is made of a material that possesses conductivity and is used as a common electrode for applying an electric field to the piezoelectric material layer.

The twenty-third mode of the present invention is an inkjet head that comprises an ink flow path formation member, which includes a common ink chamber and a plurality of ink flow paths, each extending from the common ink chamber to a nozzle via a pressure chamber, and an actuator unit that changes the capacity of the pressure chamber, wherein the ink flow path formation member has a pressure chamber opening surface that opens a part of the pressure chamber; and the actuator unit comprises: a conductive substrate constituting a common electrode of the actuator unit that is fixed to the pressure chamber opening surface and closes the pressure chamber; a film-deposition permitting region to which, when a carrier gas containing particles of a piezoelectric material is ejected, the particles adhere until a film is formed and a film-deposition inhibiting region, which inhibits the adhesion of the particles in a form of a film thereto, the film-deposition permitting region and film-deposition inhibiting region being formed on a surface of the conductive substrate opposite from the fixation surface to the ink flow path formation member; a piezoelectric material layer constituting an active layer of the actuator unit that is formed on the film-deposition permitting region; and an individual electrode that is formed such that the piezoelectric material layer is interposed between the individual electrode and the conductive substrate.

The twenty-fourth mode of the present invention is constituted such that, in the piezoelectric actuator fabrication method according to the third mode of the present invention, the value of the ratio between the Vickers hardness Hv (b) of the film-deposition permitting region and the compressive breaking strength Gv (p) of the particles in unit of GPa is in the range $0.10 \leq Gv(p)/Hv(b) \times 100 \leq 3.08$ and the ratio between the Vickers hardness Hv (b) of the film-deposition inhibiting region and the compressive breaking strength Gv (p) of the particles in unit of GPa is a value less than 0.10 or exceeding 3.08.

The twenty-fifth mode of the present invention is constituted such that, in the piezoelectric actuator fabrication method according to the third mode of the present invention, the value of the ratio between the Vickers hardness Hv (b) of the film-deposition permitting region and the compressive breaking strength Gv (p) of the particles in unit of GPa is in the range $0.11 \leq Gv(p)/Hv(b) \times 100 \leq 1.43$ and the ratio between the Vickers hardness Hv (b) of the film-deposition inhibiting region and the compressive breaking strength Gv (p) of the particles in unit of GPa is a value less than 0.10 or more than 3.08.

The twenty-sixth mode of the present invention is constituted such that, in the piezoelectric actuator fabrication method according to the third mode of the present invention, the value of the ratio between the Vickers hardness Hv (b) of the film-deposition permitting region and the compressive breaking strength Gv (p) of the particles in unit of GPa is in the range $0.11 \leq Gv(p)/Hv(b) \times 100 \leq 1.43$ and the ratio between the Vickers hardness Hv (b) of the film-deposition inhibiting region and the compressive breaking strength Gv (p) of the particles in unit of GPa is a value less than 0.11 or exceeding 1.43.

In the $1^{st}$, $2^{nd}$, $15^{th}$, $16^{th}$ or $23^{rd}$ mode of the present invention, by providing on the substrate surface a film-deposition permitting region to which particles of a piezoelectric material in a carrier gas adhere in a form of a film and a film-deposition inhibiting region which inhibits the formation of a film, a film-like piezoelectric material layer is formed through adhesion of the particles on the film-deposition permitting region when the carrier gas is ejected. As a result, the piezoelectric material layer can be formed easily in a partial region of the substrate surface.

In the $3^{rd}$ or $17^{th}$ mode of the present invention, the film-deposition permitting region and the film-deposition inhibiting region are made different by changing the mutual surface hardness. That is, the film-deposition permitting region can be afforded such a hardness that, when a carrier gas containing particles of a piezoelectric material is ejected, the particles readily adhere to form a film and the film-deposition inhibiting region is afforded such a hardness that it is difficult for the particles to adhere to form a film. Therefore, the piezoelectric material layer can be formed selectively on the film-deposition permitting region.

In the $4^{th}$ mode of the present invention, the value of the ratio between the Vickers hardness Hv (b) of the film-deposition permitting region and the Vickers hardness Hv (p) of the particles is in the range $0.39 \leq Hv(p)/Hv(b) \leq 3.08$ and the ratio between the Vickers hardness Hv (b) of the film-deposition inhibiting region and the Vickers hardness Hv (p) of the particles is a value less than 0.39 or exceeding 3.08, and, hence, the deposition of the piezoelectric material layer on the film-deposition inhibiting region can be reliably inhibited and the adhesion (film deposition properties) of the piezoelectric material layer to the film-deposition permitting region can be ensured.

In the $5^{th}$ mode of the present invention, the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.39 or more than 3.08 and, hence, the deposition of the piezoelectric material layer on the film-deposition inhibiting region can be reliably inhibited and the piezoelectric material layer can be efficiently formed on the film-deposition permitting region.

In the $6^{th}$ mode of the present invention, the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.43 or exceeding 1.43, and, hence, a layer that is thicker than the piezoelectric material layer formed on the film-deposition inhibiting region can be efficiently formed in the film-deposition permitting region.

In the $7^{th}$ or $18^{th}$ mode of the present invention, the film-deposition permitting region and the film-deposition inhibiting region are made different by affording the substrate exposed as the film-deposition permitting region such a hardness that, when a carrier gas containing particles of a piezoelectric material is ejected, the particles readily adhere to form a film and the different hardness material layer that is formed as film-deposition inhibiting region is afforded such a hardness that it is difficult for the particles adhere to form a film.

In the 8th mode of the present invention, because the different hardness material layer has an insulating property, the same also functions as an insulating layer, which makes electrical wiring straightforward.

In the 9th or 19th mode of the present invention, because an individual electrode for applying an electric field is formed on the piezoelectric material layer, each piezoelectric material layer can be individually driven.

In the 10th or 20th mode of the present invention, further, by forming the lead portions, which are connected to the individual electrodes, on the upper surface of the insulating different hardness material layer, the different hardness material layer also serves as an insulating layer for the electric wiring and, in comparison with a case where an insulating layer is formed separately, the structure and fabrication steps are simple and costs can be reduced.

In the 11th or 21st mode of the present invention, by adjusting the surface roughness of the substrate to afford the film-deposition permitting region such a surface roughness that particles of a piezoelectric material in a carrier gas readily adhere to form a film and to afford the film-deposition inhibiting region such a surface roughness that it is difficult for the particles to adhere to form a film, the piezoelectric material layer can be selectively formed on the film-deposition permitting region.

In the 12th mode of the present invention, when particles in a carrier gas collide with a buffer fluid layer that is provided to constitute the film-deposition inhibiting region, the speed of the particles is reduced and the speed energy required for adhesion as a film is lost, meaning that a film is not formed.

In the 13th mode of the present invention, because the buffer fluid layer comprises a nonvolatile fluid, it is difficult for volatilization to occur even when the pressure is reduced in the film deposition chamber in the piezoelectric layer formation step.

In the 14th or 22nd mode of the present invention, the substrate is formed by means of a conductive material and, by using the same as one electrode for applying an electric field to the piezoelectric material layers, it is not necessary to especially provide one electrode, which is advantageous from a fabrication cost standpoint.

In the 24th mode of the present invention, the value of the ratio between the Vickers hardness Hv (b) of the film-deposition permitting region and the compressive breaking strength Gv (p) of the particles in unit of GPa is in the range $0.10 \leq Gv (p)/Hv (b) \times 100 \leq 3.08$ and the ratio between the Vickers hardness Hv (b) of the film-deposition inhibiting region and the compressive breaking strength Gv (p) of the particles in unit of GPa is a value less than 0.10 or exceeding 3.08, and, hence, the deposition of the piezoelectric material layer on the film-deposition inhibiting region can be reliably inhibited and the adhesion (film deposition properties) of the piezoelectric material layer to the film-deposition permitting region can be ensured.

In the 25th mode of the present invention, the value of the ratio between the Vickers hardness Hv (b) of the film-deposition permitting region and the compressive breaking strength Gv (p) of the particles in unit of GPa is in the range $0.11 \leq Gv (p)/Hv (b) \times 100 \leq 1.43$ and the ratio between the Vickers hardness Hv (b) of the film-deposition inhibiting region and the compressive breaking strength Gv (p) of the particles in unit of GPa is a value less than 0.10 or more than 3.08 and, hence, the deposition of the piezoelectric material layer on the film-deposition inhibiting region can be reliably inhibited and the piezoelectric material layer can be efficiently formed on the film-deposition permitting region.

In the 26th mode of the present invention, the value of the ratio between the Vickers hardness Hv (b) of the film-deposition permitting region and the compressive breaking strength Gv (p) of the particles in unit of GPa is in the range $0.11 \leq Gv (p)/Hv (b) \times 100 \leq 1.43$ and the ratio between the Vickers hardness Hv (b) of the film-deposition inhibiting region and the compressive breaking strength Gv (p) of the particles in unit of GPa is a value less than 0.11 or exceeding 1.43, and, hence, a layer that is thicker than the piezoelectric material layer formed on the film-deposition inhibiting region can be efficiently formed on the film-deposition permitting region.

DESCRIPTION OF THE PREFERRED EMBODIMENTS

First Embodiment

Figure 1:
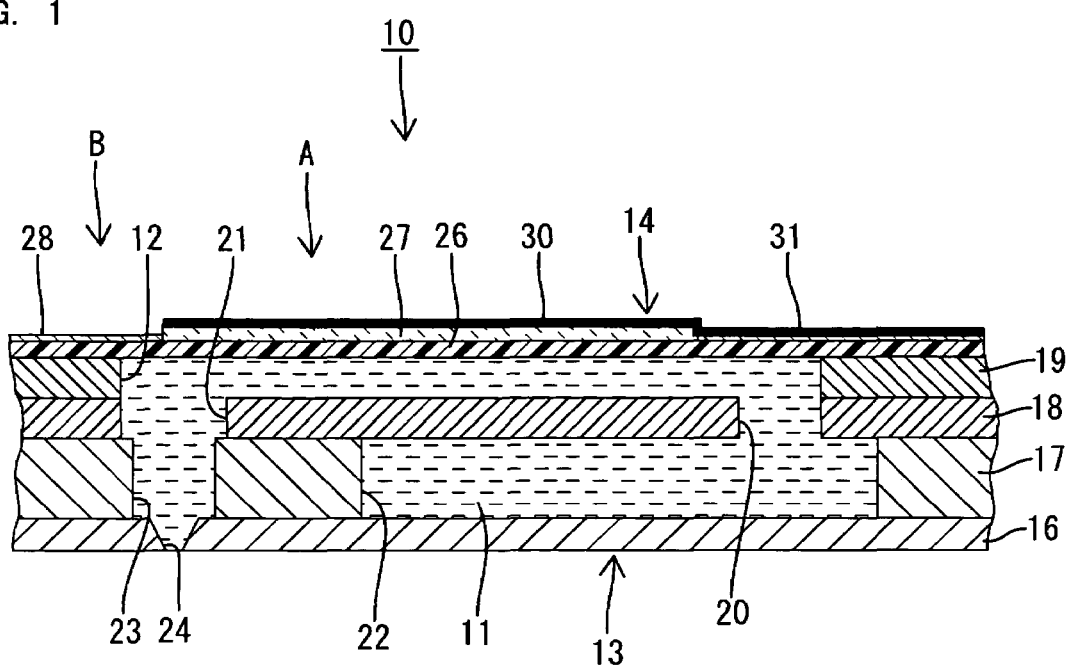
FIG. 1 is a cross-sectional view in which an inkjet head of a first embodiment of the present invention is sectioned in the length direction of a pressure chamber.
Figure 2:
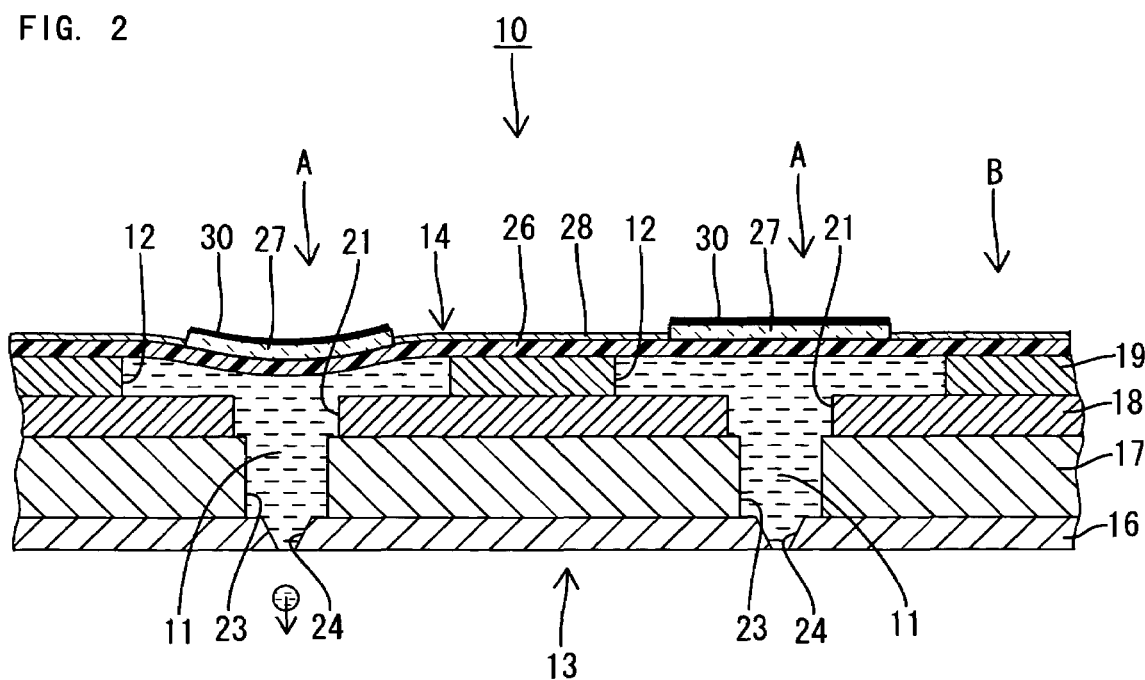
FIG. 2 is a cross-sectional view in which the inkjet head is sectioned in the breadth direction of the pressure chamber.
Figure 3:
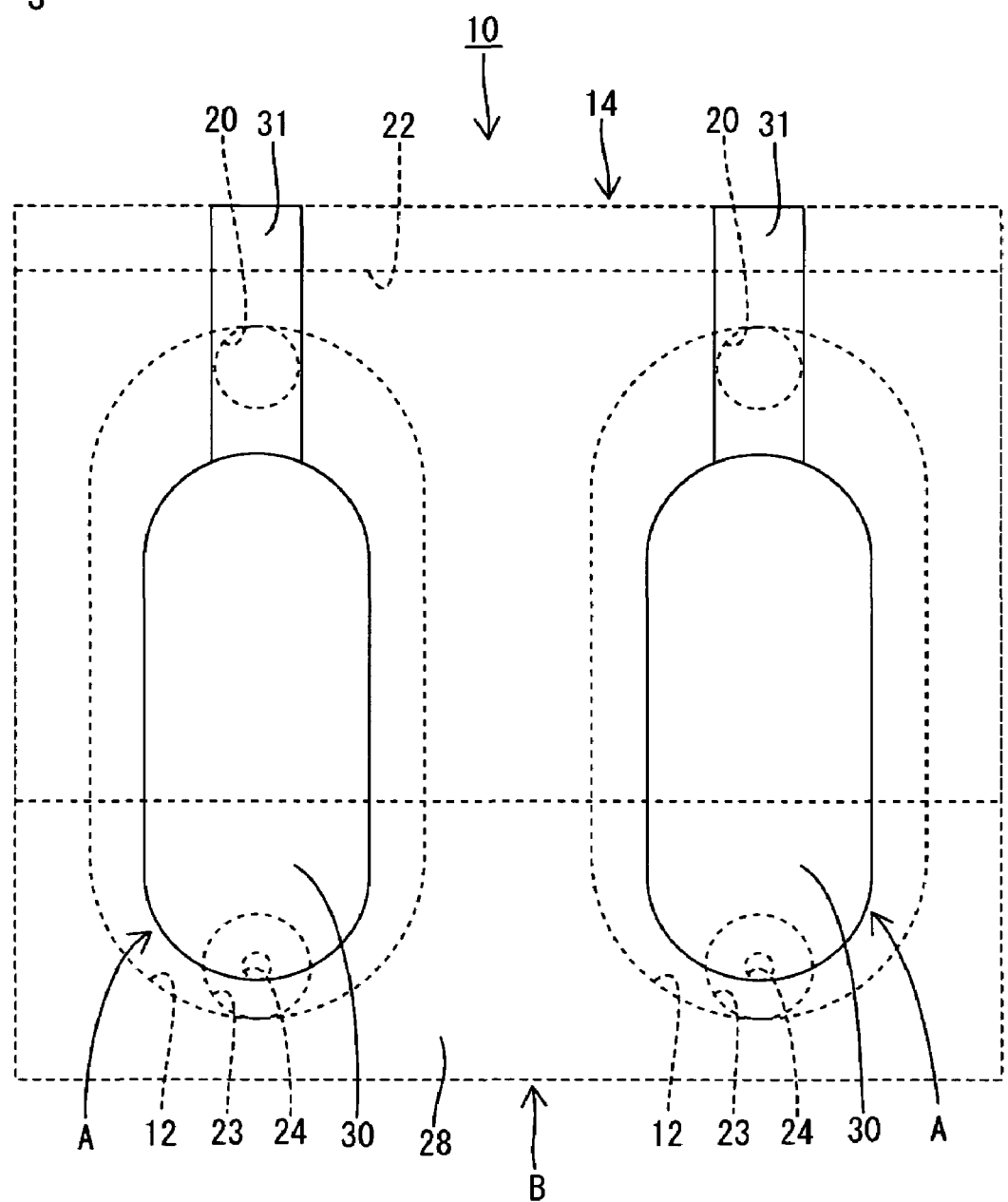
FIG. 3 is a planar view of the inkjet head.

The first embodiment of the present invention will be described with reference to FIGS. 1 to 4, 5A, 5B and 5C. FIG. 1 is a cross-sectional view in which an inkjet head 10 of this embodiment (corresponds to the 'inkjet head' of the present invention) is sectioned in the length direction of a pressure chamber 12. FIG. 2 is a cross-sectional view in which the inkjet head 10 is sectioned in the breadth direction of the pressure chamber 12. FIG. 3 is a planar view of the inkjet head 10 that shows a part of the inkjet head 10 together with each of the drawings.

The inkjet head 10 comprises an ink flow path formation member 13 that comprises a plurality of pressure chambers 12 with a form in which ink 11 is accommodated and an upper face is open, and an actuator unit 14 that is secured to the upper surface of the ink flow path formation member 13.

The ink flow path formation member 13 has a planar shape overall and is constituted such that a nozzle plate 16, manifold plate 17, flow path plate 18 and pressure chamber plate 19 are sequentially stacked in layers and the plates 16, 17, 18, and 19 are joined to one another by means of an epoxy-type heat-curable adhesive.

The pressure chamber plate 19 is formed by means of stainless steel or another metallic material and a plurality of pressure chambers 12 is provided in aligned fashion in the pressure chamber plate 19. Each pressure chamber 12 is long and thin in one direction and is substantially oval when viewed from above. The flow path plate 18 is similarly formed by means of stainless steel or another metallic material, and a manifold flow path 20 and a pressure flow path 21 that communicate with the two ends of the pressure chamber 12 are each provided in the flow path plate 18. The manifold plate 17 is also formed by means of stainless steel or another metallic material and a common ink chamber 22 that extends in the breadth direction of the pressure chamber 12, communicates with each manifold flow path 20 and is connected to an ink tank (not shown) and a nozzle flow path 23 that is connected to the pressure flow path 21 are formed in the manifold plate 17. In addition, the nozzle plate 16 is formed by means of a polyimide-type synthetic resin material and a nozzle 24 for ejecting the ink 11 is formed connected to the nozzle flow path 23. Thus, a flow path, which extends from the common ink chamber 22 connected to the ink tank to the nozzle 24 via the manifold flow path 20, the pressure chamber 12, the pressure flow path 21 and the nozzle flow path 23, is formed.

The actuator unit 14 comprises a substrate 26 that closes the pressure chamber 12. The substrate 26 is formed by means of a conductive metal material such as stainless steel as described subsequently. The substrate 26 is bonded so as to cover the whole of the upper surface of the ink flow path formation member 13 by joining the substrate 26 by means of an epoxy-type heat-curable adhesive to the upper surface of the pressure chamber plate 19. Further, the substrate 26 is connected to the ground of a driver circuit (not shown) and is also used as a common electrode.

A piezoelectric material layer 27 that constitutes an active layer of the actuator unit 14 is formed on the upper surface of the substrate 26 of the actuator unit 14, in each of the positions corresponding with each of the pressure chambers 12. Each piezoelectric material layer 27 is formed from a piezoelectric ceramic material of a ferroelectric substance such as lead zirconate titanate (PZT), has a uniform thickness overall and has a substantially oval shape that is slightly smaller than that of the pressure chamber 12 when viewed from above. Further, a different hardness material layer 28 comprising an insulating material with a different hardness from that of the substrate 26 overall is formed in a region excluding the region where the piezoelectric material layers 27 are provided on the upper surface of the substrate 26. The different hardness material layer 28 has a uniform thickness overall and is thinner than the piezoelectric material layer 27. On the upper surface of the substrate 26, regions of the upper surface that corresponds to the piezoelectric material layers 27 are film-deposition permitting regions A and a region constituted by the different hardness material layer 28 is a film-deposition inhibiting region B. As will be described subsequently, in the piezoelectric layer formation step, the particles of the piezoelectric material in the carrier gas adhere in a form a film to the film-deposition permitting regions A and the adhesion of the particles in a form of a film to the film-deposition inhibiting region B are inhibited.

Furthermore, at the upper surface of the actuator unit 14, individual electrodes 30 comprising a thin film-like conductor are formed over the whole of the upper surface of each of the piezoelectric layers 27. Further, a plurality of lead portions 31 similarly comprising a thin film-like conductor and connected to each of the individual electrodes 30 is formed on the upper surface of the different hardness material layer 28. Each lead portion 31 is connected electrically to a driver circuit (not shown). Polarization processing has been performed on the piezoelectric layers 27 to polarize the same in the thickness direction thereof. When the potential of the individual electrode 30 is rendered a higher potential than that of the substrate 26, which is a common electrode, by means of the driver circuit, an electric field is applied to the piezoelectric layer 27 in the polarization direction thereof (direction from the individual electrode 30 to the substrate 26). Further, the piezoelectric material layer 27 expands in the thickness direction thereof and contracts a direction along the surface of the substrate 26. As a result, as shown on the left in FIG. 2, the piezoelectric layer 27 and substrate 26 (that is, actuator unit 14) is locally deformed so as to be convex on the side of the pressure chamber 12 (unimorph deformation). Hence, the capacity of the pressure chamber 12 drops and the pressure of the ink 11 rises, whereby the ink 11 is ejected from the nozzle 24. Thereafter, when the individual electrode 30 returns to the same potential as that of the substrate 26, which is a common electrode, the piezoelectric material layer 27 and substrate 26 assume their original shape and the capacity of the pressure chamber 12 returns to its original capacity, whereby the ink 11 is taken up by the common ink chamber 22.

The fabrication method of the inkjet head 10 of this embodiment will be described below.

Flow Path Formation Member Creation Step

First, with the exception of the nozzle plate 16, the manifold plate 17, flow path plate 18 and pressure chamber plate 19 are stacked and joined in a state where the same are aligned with one another. Here, holes that correspond with the nozzles 24, pressure chambers 12 and common ink chamber 22, and so forth are pre-provided in each of the plates 16, 17, 18 and 19. As a result, an ink flow path formation member 13 in a state where the upper surface of each pressure chamber 12 is open is created. Further, because the nozzle plate 16 is formed from a synthetic resin material that is susceptible to heat and there is therefore a risk of deformation as a result of the annealing of the piezoelectric layer formation step (described subsequently), the nozzle plate 16 is joined to the manifold plate 17 following the piezoelectric layer formation step.

Substrate Fixation Step

Thereafter, the substrate 26 of the actuator unit 14 is stacked and joined in a state of alignment with the upper surface of the pressure chamber plate 19 of the ink flow path formation member 13 and each pressure chamber 12 is closed by means of the substrate 26.

Film Deposition Region Formation Step

Figure 4:
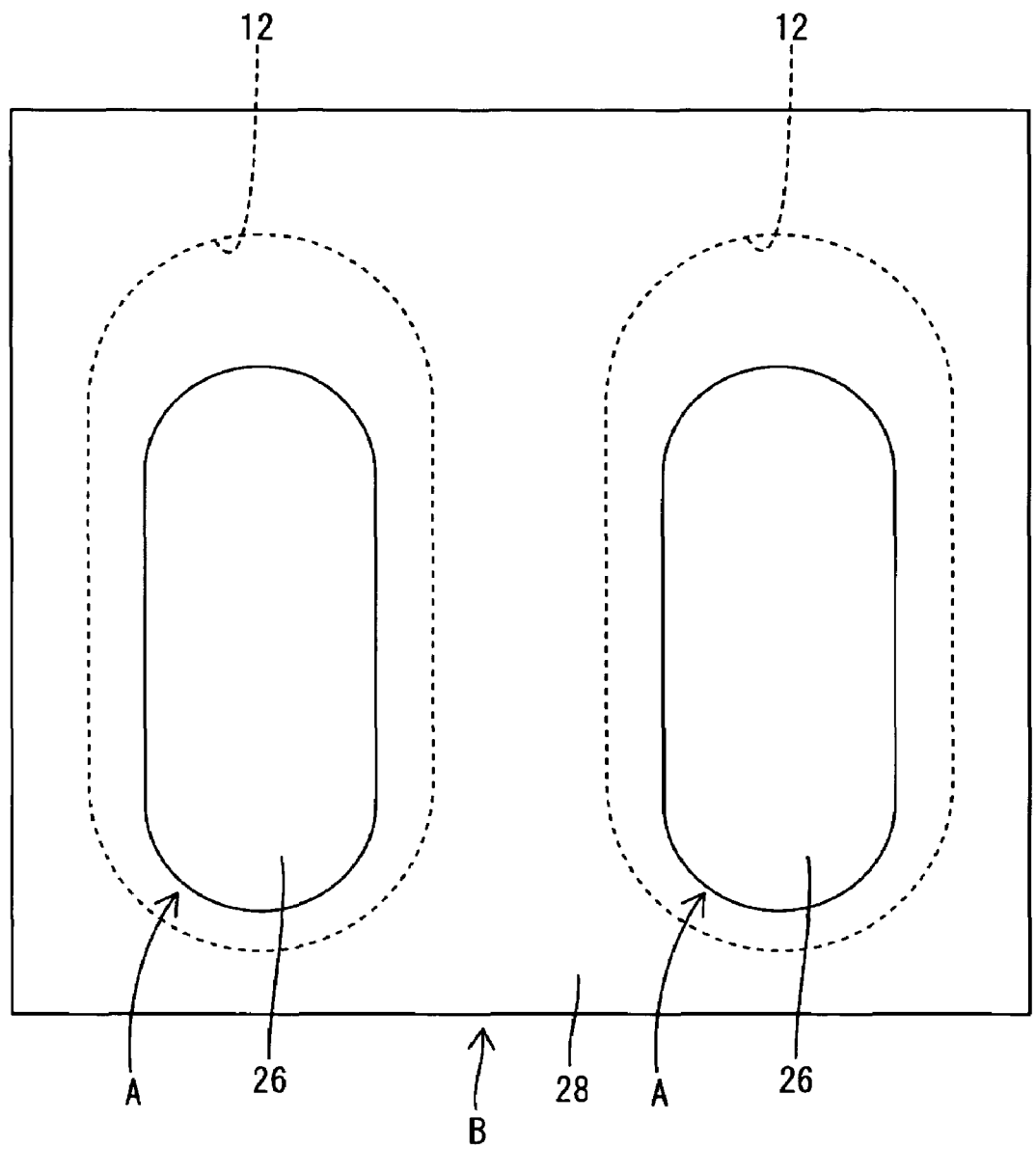
FIG. 4 is a planar view of when a different hardness material layer is formed on a substrate.
Figure 5:
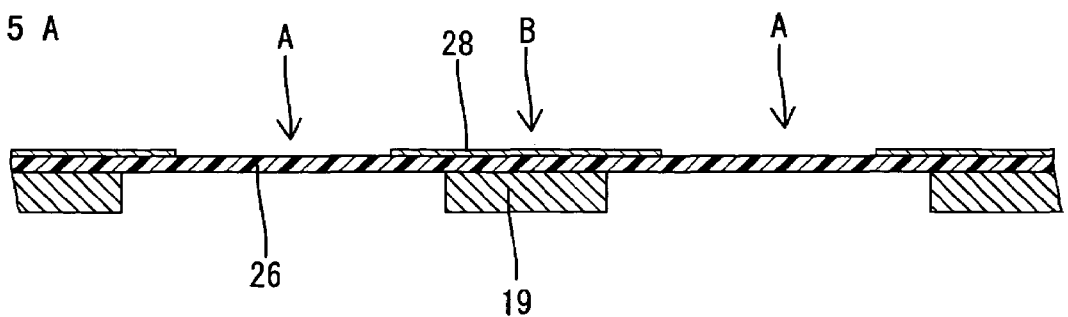
FIG. 5A is a cross-sectional view of when a different hardness material layer is formed on the substrate.
FIG. 5B is a cross-sectional view of when a carrier gas containing particles of a piezoelectric material is ejected onto a substrate.
FIG. 5C is a cross-sectional view of when an individual electrode is formed on the upper surface of the piezoelectric material layer.
Figure 5:
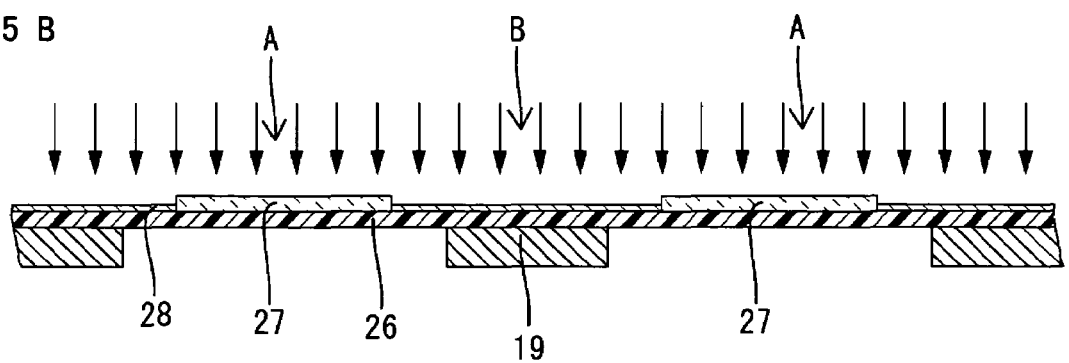
Figure 5:
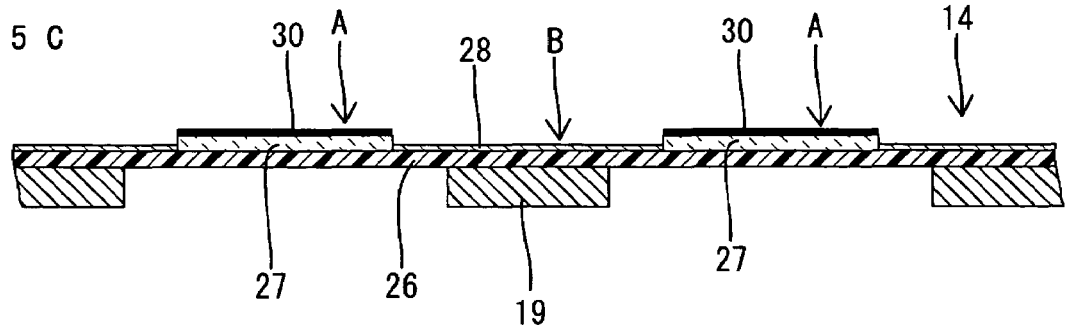

Thereafter, as shown in FIGS. 4 and 5A, by forming the different hardness material layer 28, which has a different surface hardness from that of the substrate 26, on the substrate

26 by means of patterning, the film-deposition permitting regions A constituted by exposed regions of the surface of the substrate 26 and the film-deposition inhibiting region B constituted by the different hardness material layer 28 are provided. In the subsequent piezoelectric layer formation step, the piezoelectric material layers 27 are formed by causing a carrier gas containing particles of a piezoelectric material such as lead zirconate titanate (PZT) to be ejected onto the surface of the substrate 26 to adhere thereto in the form of a film, the film-deposition permitting regions A being regions where the particles adhere until a film is formed in each region when the carrier gas is ejected, that is, regions where the piezoelectric material layers 27 are formed, and the film-deposition inhibiting region B is a region where the adhesion of the particles in a form of a film when the carrier gas is ejected is inhibited.

According to this embodiment, the film-deposition permitting regions A and film-deposition inhibiting region B are distinguished by a difference in the surface hardness thereof. The present inventors found that the relationship between the hardness of the substrate and the hardness of the particles of the piezoelectric material or the relationship between the hardness of the substrate and the compressive breaking strength of the particles of the piezoelectric material affects the result of whether the piezoelectric layer is deposited as a film and discovered that, as described subsequently, the piezoelectric material is deposited as a film when the value of the ratio between the Vickers hardness Hv (b) of the surface of the substrate and the Vickers hardness Hv (p) of the particles of the piezoelectric material is $0.39 \leq Hv(p)/Hv(b) \leq 3.08$ or when the value of the ratio between the Vickers hardness Hv (b) of the surface of the substrate and the compressive breaking strength Gv (p) of the particles of the piezoelectric material in unit of GPa is $0.10 \leq Gv(p)/Hv(b) \times 100 \leq 3.08$. In addition, the present inventors discovered that, when the value of the former ratio is in the range $0.43 \leq Hv(p)/Hv(b) \leq 1.43$ or the value of the latter ratio is in the range $0.11 \leq Gv(p)/Hv(b) \times 100 \leq 1.43$, the formation of the piezoelectric material layer is efficiently performed in a short time. The present embodiment determines the respective hardness of the respective surfaces of the film-deposition permitting region A and film-deposition inhibiting region B on the basis of a condition for the ratio between the respective hardness or the basis of a condition for the ratio between the hardness and the compressive breaking strength.

The substrate 26 comprising a conductive metallic material with a hardness whereby a film is readily formed through the adhesion of particles when a carrier gas containing particles of a piezoelectric material is ejected. When the piezoelectric material is lead zirconate titanate (PZT), the Vickers hardness of the particles is Hv 300 to 400 or the compressive breaking strength is 0.8 to 4.0 GPa. Therefore, a piezoelectric material with a Vickers hardness at the surface of Hv 280 to 700 is selected for the substrate 26 to satisfy the above hardness ratio or the above hardness/compressive breaking strength ratio. More specifically, stainless steel, nickel alloy, or nickel or the like of Hv 450 to 600, for example, is used.

On the other hand, the different hardness material layer 28 comprising a material that possesses a different hardness from that of the substrate 26 and is made of an insulating material with a low dielectric constant, whereby, when a carrier gas containing particles of a piezoelectric material is ejected, the particles do not readily adhere thereto to form a film in comparison with the substrate 26 in the piezoelectric layer formation step (described subsequently). In cases where the piezoelectric material is lead zirconate titanate (PZT), a material with a Vickers hardness at the surface that is less than Hv 280 or exceeds Hv 700 is selected for the different hardness material layer.

As an insulating material with a low dielectric constant that is not as hard as the substrate 26, a polyimide resin of Hv 100 or less, for example, is used, and, in addition, an epoxy resin, polyethylimide resin, polyphenylene sulfide resin, fluorine resin, fluorinated polymer resin, a noncrystalline polyolefin resin, syndiotactic polystyrene resin, an organic silica, fluorinated carbon, COPNA resin, oxazole resin, paraxylene resin, and so forth, may be used.

A variety of methods may be used to form a polyimide resin in a pattern shape on the substrate 26 as the different hardness material layer 28. For example, the different hardness material layer 28 is formed in a pattern shape by forming polyimide resin layers over the whole the surface of the substrate 26 by means of electrolytic deposition (plating, where a conductive substrate is disposed in a polyimide solution and polyimide is formed on the substrate by applying a voltage between electrodes, for example) or by means of spin coating and then removing parts corresponding to the film-deposition permitting regions A in the polyimide resin layer through laser irradiation.

Further, an insulating material with a low dielectric constant that is harder than the substrate 26 can also be used as the different hardness material layer 28. For example, alumina of Hv 1400 to 2000 may be used and, in addition, silicon nitride, silicon oxide, aluminum nitride, silicon carbide, diamond-like carbon of Hv 1000 to 2000, and TiN of Hv 1500 to 2200, and so forth, can be employed.

For example, formation as per (A) or (B) that follow may be performed in order to form alumina or the like in the form of a pattern as the different hardness material layer 28 on the surface of the substrate 26. (A) First, an alumina layer is formed over the whole of the surface of the substrate 26 by means of CVD (Chemical Vapor Deposition) or AD. Thereafter, a laser is irradiated onto the alumina layer to remove parts that correspond to the film-deposition permitting regions A. (B) A resist is formed through patterning in the area corresponding to the film-deposition inhibiting region of the surface of the substrate 26. Thereafter, an alumina layer is formed over the whole of the surface of the substrate 26 by means of CVD or AD. Finally, the resist is removed. In this case, the alumina layer is formed very thinly in comparison with the piezoelectric material layer 27. Hence, the generation of chips and cracks, and so forth, is not a problem.

Piezoelectric Layer Formation Step

Figure 6:
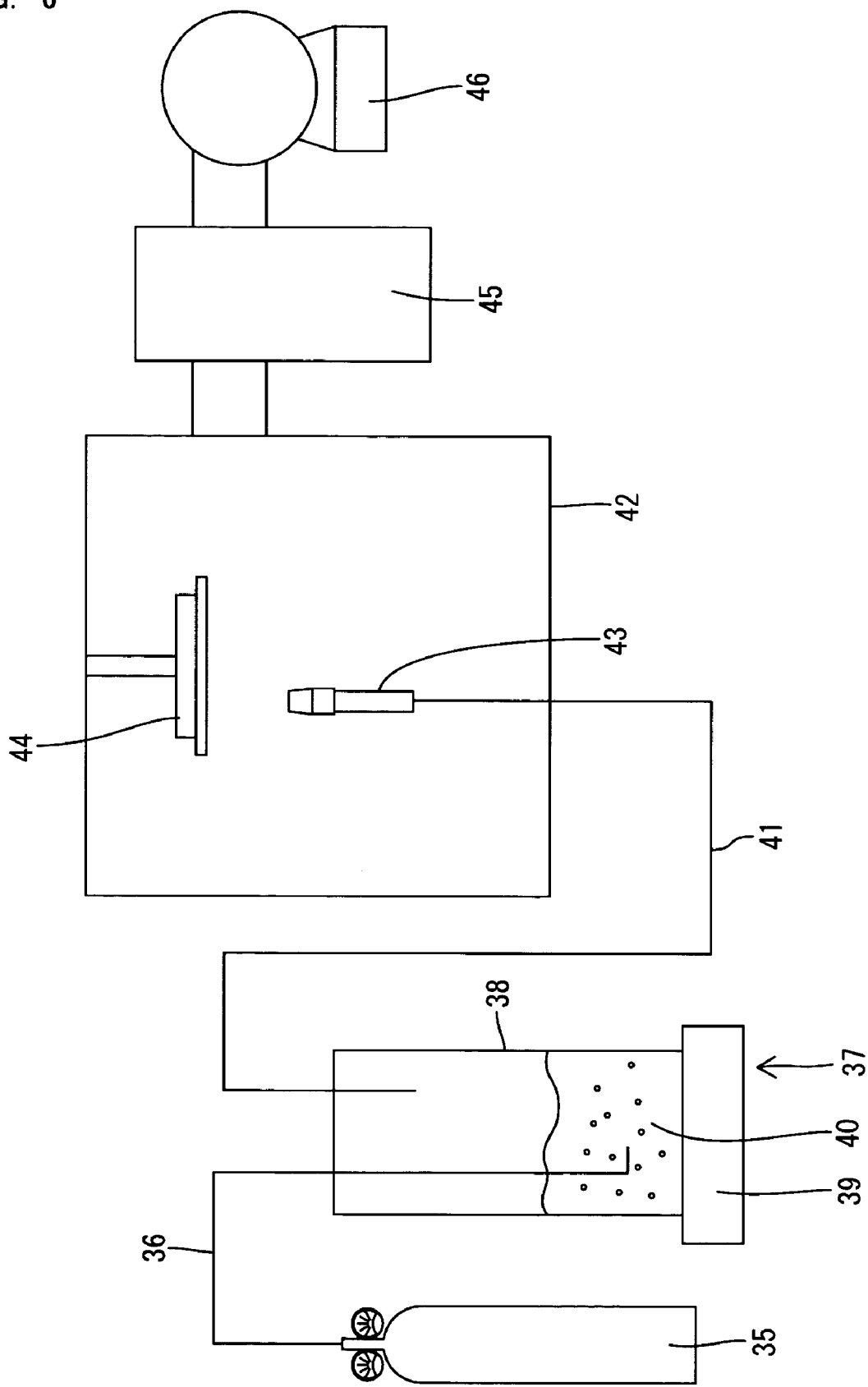
FIG. 6 is an overview of a film deposition device.

Thereafter, the piezoelectric material layers 27 of the actuator unit 14 are formed by means of aerosol deposition (AD). FIG. 6 is a schematic view of a film deposition device for forming the piezoelectric material layers 27. The reference numeral 35 is a gas cylinder for supplying an inert gas such as helium, argon or nitrogen, or air, or the like as the carrier gas. The carrier gas is sent from the gas cylinder 35 to an aerosol generator 37 via an inlet pipe 36. The aerosol generator 37 comprises an aerosol chamber 38, the inside of which can be filled with particle powder of a piezoelectric material and a vibration device 39 that causes the aerosol chamber 38 to vibrate and, by introducing the carrier gas to the aerosol chamber 38 while agitating the particle powder 40 of a piezoelectric material that fill the aerosol chamber 38, the particle powder 40 are made to float in the gas to become aerosol. Further, an inert gas such as helium, argon, or nitrogen, or air or oxygen or the like, for example, can be employed as the carrier gas. Further, lead zirconate titanate (PZT), crystal, lithium niobate, barium titanate, lead titanate, lead metaniobate, zinc oxide, or the like, for example, can be used as the piezoelectric material.

The aerosolated carrier gas containing particles of a piezoelectric material is sent from the aerosol chamber 38 to a nozzle 43 that is provided within a film deposition chamber 42 via an aerosol introduction pipe 41. A stage 44 for attaching the substrate 26 is provided at the tip of the nozzle 43 within the film deposition chamber 42 and the carrier gas is ejected from the nozzle 24 toward the substrate 26. Further, a vacuum pump 46 is connected to the film deposition chamber 42 via a powder recovery device 45, whereby the pressure within the film deposition chamber 42 is reduced.

As a result of the film deposition device above, a carrier gas containing particles of a piezoelectric material is ejected uniformly over the whole of the surface of the substrate 26 that has undergone the film deposition formation step. Thus, as shown in FIG. 5B, the film-like piezoelectric material layers 27 are formed as a result of particles of a piezoelectric material in the carrier gas colliding with, adhering to and being deposited on the exposed surfaces of the substrate 26 constituting the film-deposition permitting regions A. On the other hand, the particles of the piezoelectric material in the carrier gas collide with the different hardness material layer 28 constituting the film-deposition inhibiting region B. Here, the different hardness material layer 28 is afforded a hardness that makes it difficult for particles to adhere to form a film when a carrier gas containing particles of piezoelectric material is ejected. Therefore, the particles do not adhere to form a film to the different hardness material layer 28 or, even if the particles adhere to form a film, the film is very thin and a film is not formed with the same thickness as those of the film-deposition permitting regions A. Thus, the piezoelectric material layers 27 are formed selectively in the film-deposition permitting regions A on the surface of the substrate 26. Thereafter, if required, annealing of the piezoelectric material layers 27 is performed. Further, when a thin film of a piezoelectric material is formed on the different hardness material layer 28 as described earlier, because such a thin film has low adhesion with respect to the substrate 26, there are frequent cases of the film peeling and failing in the annealing process. Further, processing to remove the thin film of piezoelectric material that has formed on the different hardness material layer 28 may be performed. This processing may involve sticking sticky tape to extend across the film-deposition permitting regions A and film-deposition inhibiting region B and then peeling off the sticky tape or dusting the substrate from the reverse side.

Individual Electrode Formation Step

Thereafter, as shown in FIG. 5C, an individual electrode 30 is formed on the upper surface of each piezoelectric material layer 27 and a plurality of lead portions 31 that are connected to each individual electrode 30 is formed on the upper surface of the different hardness material layer 28. In order to form the individual electrodes 30 and lead portions 31, after a conductive film is formed over the whole of the piezoelectric material layers 27 and different hardness material layer 28, the conductive film is formed into a predetermined pattern by using photolithographic and etching techniques, or the patterned conductive film is printed directly on the upper surface of the piezoelectric material layers 27 and different hardness material layer 28, for example.

Following the individual electrode formation step, an electric field that is stronger than that applied during a normal ink ejecting operation is applied between the individual electrodes 30 and the substrate 26, which is a common electrode, to polarize the piezoelectric material layer 27 between the two electrodes in the thickness direction thereof (polarization). The inkjet head 10 is completed as described above.

A test that is performed based on the present inventors' own knowledge and leads to the determination of a condition for making the film-deposition permitting regions A and film-deposition inhibiting region B will be described next.

Test 1: Substrate Hardness and Film Deposition Speed

Data 1-1

A ferritic stainless steel (SUS 430 prescribed by Japanese Industrial Standards) plate with a Vickers hardness of Hv 290 at the substrate surface onto which aerosol is ejected was employed for the substrate. The substrate surface was subjected to polishing to achieve a roughness $Rz \leq 0.7$ (Rz refers to ten-point mean roughness prescribed by Japanese Industrial Standards). Further, PZT with a Vickers hardness of Hv 300 to 400 and an average particle diameter of 0.3 to 1 µm was used for the material particles.

Further, the regulation of the hardness of the surface of the stainless steel substrate was executed by heating the substrate in air or in a vacuum at 400 to 800° C. to change the surface properties. Further, measurement of Vickers hardness was executed by means of nano indention. A test was performed with a testing force F=0.015 N by using Nano-Hardness Tester (available from +csm corp.) as the measurement device and a Berkovich indenter as the indenter.

A piezoelectric material layer with a thickness of 10 µm was formed on the substrate by means of the same film deposition device as that of the embodiment above. The film deposition conditions were a pressure in the film deposition chamber of 150 Pa, a pressure in the aerosol chamber of 30000 Pa, a nozzle opening size of 10 mm×0.4 mm, a carrier gas type He, a nozzle substrate relative speed of 1.2 mm/sec, a distance between nozzle and substrate of 10 to 20 mm, and a particle speed of 250 m/sec. The film deposition speed of the piezoelectric layer was then measured.

Data 1-2

Except using ferritic stainless steel (SUS 430 prescribed by Japanese Industrial Standards) plate with a Vickers hardness of Hv 440 at the surface of the substrate onto which aerosol is ejected for the substrate, film deposition was performed in the same manner as data 1-1 and the film deposition speed was measured.

Data 1-3

Except using a substrate with a Vickers hardness of Hv 700 at the surface that was produced by depositing Pt by means of sputtering beforehand onto the surface onto which aerosol is ejected of the stainless substrate (SUS 430 prescribed by Japanese Industrial Standards) plate for the substrate, film deposition was performed in the same manner as data 1-1 and the film deposition speed was measured.

Data 1-4

Except using a gold-plated plate with a Vickers hardness of Hv 130 for the substrate, film deposition was performed in the same manner as data 1-1 and the film deposition speed was measured.

Data 1-5

Except using a ferritic stainless steel (SUS 430 prescribed by Japanese Industrial Standards) plate with a Vickers hardness of Hv 210 for the substrate, film deposition was performed in the same manner as data 1-1 and the film deposition speed was measured.

Data 1-6

Except using a ferritic stainless steel (SUS 430 prescribed by Japanese Industrial Standards) plate with a Vickers hardness of Hv 280 for the substrate, film deposition was performed in the same manner as data 1-1 and the film deposition speed was measured.

Data 1-7

Except using a platinum plate with a Vickers hardness of Hv 770 at the surface that is produced by pre-applying paste-like Pt onto the surface onto which aerosol is sprayed of a ceramic plate and then sintering at 850 to 1200° C. for the substrate, film deposition was performed in the same manner as data 1-1 and the film deposition speed was measured.

Results and Discussions

Data for the substrate quality, Vickers hardness and film deposition speed are shown in Table 1.

TABLE 1

| Substrate Material | Hardness of Substrate (Hv) | Hv (p)/Hv (b) | Film Deposition Speed (μm/s) |
|---|---|---|---|
| Au | 130 | 2.31-3.08 | 1.30E-01 |
| SUS 430 | 210 | 1.43-1.90 | 1.40E-01 |
| SUS 430 | 280 | 1.07-1.43 | 2.20E-01 |
| SUS 430 | 290 | 1.03-1.38 | 2.90E-01 |
| SUS 430 | 440 | 0.68-0.91 | 2.70E-01 |
| Pt/SUS 430 | 700 | 0.43-0.57 | 2.10E-01 |
| Pt/Ceramic | 770 | 0.39-0.52 | 1.50E-01 |

As shown in Table 1, in cases where the hardness of the substrate is Hv 130, the film deposition speed was slow at 0.13 μm/sec. When the hardness of the substrate was increased, the film deposition speed gradually increased and increased abruptly in the vicinity of a hardness Hv 280 in particular and reached a maximum value at 0.29 μm/sec when the hardness was Hv290. This is thought to be because the particles adhere strongly to the substrate or on particles that have adhered beforehand as a result of the large proportion of pulverization of particles that have collided with the substrate surface.

When the hardness of the substrate was increased further, the film deposition speed gradually dropped and the film deposition speed dropped sharply close to Hv700. This is thought to be because particles bounce at the substrate surface and it is difficult for same to dent into the substrate surface. The film deposition speed is favorable for an application in the range a substrate hardness of up to Hv 700 and, it was confirmed through visual observation that the piezoelectric material layer had been formed without a gap and adhesion was favorable. When the hardness was increased further, the film deposition speed dropped further.

It was confirmed that, by making the Vickers hardness Hv (b) of the substrate in the film-deposition permitting region in the range 130 to 770 as described hereinabove, that is, by making the ratio between the Vickers hardness Hv (b) of the surface of the substrate on the side where particles adhere and the Vickers hardness Hv (p) of the particles in the range $0.39 \leq Hv(p)/Hv(b) \leq 3.08$, growth of the film may be reliably expected. More particularly within this range, it was clear that it was preferable if, by making the Vickers hardness Hv (b) of the substrate in the film-deposition permitting region in the range 280 to 700, that is, by making the ratio between the Vickers hardness Hv (b) of the surface of the substrate on the side where particles adhere and the Vickers hardness Hv (p) of the particles in the range $0.43 \leq Hv(p)/Hv(b) \leq 1.43$, a piezoelectric material layer that adequately satisfies the adhesion is reliably formed in a short time. In addition, more particularly within this range, it was found that it is possible to implement a fabrication method for the piezoelectric material layer in which the film deposition speed at which the piezoelectric material layer is formed is stable at high speeds and that is also superior from the perspective of productivity and fabrication costs (material costs of the particles) by establishing the Vickers hardness Hv (b) of the substrate in the film-deposition permitting region in the range 290 to 440, that is, in the range $0.68 \leq Hv(p)/Hv(b) \leq 1.38$.

Test 2: Effect of Aerosol Spray Speed on Deposition or Non-deposition of Film

Thereafter, an examination of the deposition or non-deposition of a film when the aerosol spray speed is changed was conducted. The same substrate and material particles as for data 1-1 were selected and the particle speed of the material particles was selected in the range 150 m/s to 400 m/s. The other film deposition conditions are the same as those of data 1-1.

Results and Discussions

Data that is related to the deposition or non-deposition of a film when the particle speed is changed is shown in Table 2. The film deposition speed is displayed as 'G' (Good) when same is equal to or more than 0.1 μm/s and is displayed as 'NG' (No Good) when the film deposition speed is less than 0.1 μm/s. Further, the combination of an unmeasured particle speed and hardness ratio is displayed as '–'.

TABLE 2

| | Hardness Ratio | | | | | | |
|---|---|---|---|---|---|---|---|
| Particle Speed (m/s) | no less than 0 and less than 0.25 | 0.25-0.5 | 0.5-1.0 | 1.0-1.5 | 1.5-2.0 | 2.0-2.5 | 2.5-3.0 |
| 350-400 | NG | G | G | G | G | G | G |
| 300-350 | NG | G | G | G | G | G | G |
| 250-300 | NG | G | G | G | G | G | G |
| 200-250 | NG | G | G | G | G | G | G |
| no less than 150 and less than 200 | — | — | G | — | — | — | — |

As shown in table 2, when the ratio between the Vickers hardness Hv (b) at the surface onto which aerosol is sprayed of the substrate and the Vickers hardness Hv (p) of the particles was in the range 0 to 0.25, film deposition was not completed even when the aerosol particle speed was changed to within 200 m/s to 400 m/s. However, when the ratio between Hv (b) and HV (p) was in the range 0.25 to 3.0, film deposition was confirmed even when the aerosol particle speed was set anywhere in the range 150 m/s to 400 m/s (except for a combination of the hardness ratio and particle speed where the film deposition speed was not measured).

According to the above results, it was thought that the effect of the aerosol particle speed on the deposition or non-deposition of the film was small.

Test 3: Substrate Hardness and Particle Compressive Breaking Strength, and Film Deposition Speed In AD, because particles are pulverized and adhere to the substrate by the energy with which the particles collide with the substrate, not only the ratio between the hardness of the substrate and material particles but also the ratio between the hardness of the substrate and the compressive breaking strength of the material particles affect the film deposition speed. Further, the definition of the compressive breaking strength is:

compressive breaking strength=tensile stress acting on particle during compression breaking=$0.9 \times Fd/d^2$. Here, Fd is the compressive force acting on the particle when the particle is broken and d is the particle diameter in a direction that intersects the compressive force at right angles when the particle is broken. More specifically, the compressive force acts on the particle from a vertical direction and, when the particle is observed from above, a diameter of a circle having the same area as the projected cross section area of the particle when the particle is broken is the particle diameter.

Data 3-1

A ferritic stainless steel (SUS 430 prescribed by Japanese Industrial Standards) plate with a Vickers hardness of Hv 290 at the substrate surface onto which aerosol is sprayed was employed for the substrate. The substrate surface was subjected to polishing to achieve a roughness Rz≦0.7 (Rz refers to ten-point mean roughness prescribed by Japanese Industrial Standards). Further, PZT with a compressive breaking strength of 0.8 to 4.0 GPa and an average particle diameter of 0.3 to 1 μm was used for the material particles.

Further, the regulation of the hardness of the surface of the stainless use steel substrate was executed by heating the substrate in air or in a vacuum at 400 to 800° C. to change the surface properties. Further, measurement of Vickers hardness was executed by means of nano indention. A test was performed with a testing force F=0.015 N by using the Nano-Hardness Tester (available from +csm Corp.) as the measurement device and a Berkovich indenter as the indenter. The Nano-Hardness Tester was also used for the measurement of the compressive breaking strength.

A piezoelectric material layer with a thickness of 10 μm was formed on the substrate by means of the same film deposition device as that of the embodiment above. The film deposition conditions were a pressure in the film deposition chamber of 150 Pa, a pressure in the aerosol chamber of 30000 Pa, a nozzle opening size of 10 mm×0.4 mm, a carrier gas type He, a nozzle substrate relative speed of 1.2 mm/sec, a distance between nozzle and substrate of 10 to 20 mm, and a particle speed of 250 m/sec. The film deposition speed of the piezoelectric layer was then measured.

Data 3-2

Except using ferritic stainless steel (SUS 430 prescribed by Japanese Industrial Standards) plate with a Vickers hardness of Hv440 at the surface of the substrate onto which aerosol is sprayed for the substrate, film deposition was performed in the same manner as data 3-1 and the film deposition speed was measured.

Data 3-3

Except using a substrate with a Vickers hardness of Hv 700 at the surface that was produced by depositing Pt by means of sputtering beforehand onto the surface onto which aerosol is sprayed of the stainless use substrate (SUS 430 prescribed by Japanese Industrial Standards) for the substrate, film deposition was performed in the same manner as data 3-1 and the film deposition speed was measured.

Data 3-4

Except using a gold-plated plate with a Vickers hardness of Hv130 for the substrate, film deposition was performed in the same manner as data 3-1 and the film deposition speed was measured.

Data 3-5

Except using a ferritic stainless steel (SUS 430 prescribed by Japanese Industrial Standards) plate with a Vickers hardness of Hv 210 for the substrate, film deposition was performed in the same manner as data 3-1 and the film deposition speed was measured.

Data 3-6

In addition to using a ferritic stainless steel (SUS 430 prescribed by Japanese Industrial Standards) plate with a Vickers hardness of Hv 280 for the substrate, film deposition was performed in the same manner as data 3-1 and the film deposition speed was measured.

Data 3-7

Except using a platinum plate with a Vickers hardness of Hv770 at the surface that is produced by pre-applying paste-like Pt onto the surface onto which aerosol is sprayed of a ceramic plate and then sintering at 850° to 1200° for the substrate, film deposition was performed in the same manner as data 3-1 and the film deposition speed was measured.

Results and Discussions

Data for the substrate quality, the Vickers hardness Hv(b) of the substrate, and the ratio between the Vickers hardness Hv(b) of the substrate and the compressive breaking strength Gv(p)[GPa] of the material particles, and film deposition speed are shown in Table 3.

TABLE 3

| Substrate Material | Hardness of Substrate Hv (b) | Gv (p)/Hv (b) × 100 | Film Deposition Speed (μm/s) |
| --- | --- | --- | --- |
| Au | 130 | 0.62 to 3.08 | 1.30E−01 |
| SUS 430 | 210 | 0.38 to 1.90 | 1.40E−01 |
| SUS 430 | 280 | 0.29 to 1.43 | 2.20E−01 |
| SUS 430 | 290 | 0.28 to 1.38 | 2.90E−01 |
| SUS 430 | 440 | 0.18 to 0.91 | 2.70E−01 |
| Pt/SUS 430 | 700 | 0.11 to 0.57 | 2.10E−01 |
| Pt/Ceramic | 770 | 0.10 to 0.52 | 1.50E−01 |

As shown in Table 3, in cases where the hardness of the substrate is Hv 130, the film deposition speed was slow at 0.13 μm/sec. When the hardness of the substrate was increased, the film deposition speed gradually increased and increased abruptly in the vicinity of a hardness Hv 280 in particular and reached a maximum value at 0.29 μm/sec when the hardness was Hv 290. This is thought to be because the particles adhere strongly to the substrate or on particles that have adhered beforehand as a result of the large proportion of pulverization of particles that have collided with the substrate surface.

When the hardness of the substrate was increased further, the film deposition speed gradually dropped and the film deposition speed dropped sharply close to Hv 700. This is thought to be because particles bounce at the substrate surface and it is difficult for same to dent the substrate surface. The film deposition speed is favorable for an application in the range of a substrate hardness of up to Hv 700 and, it was confirmed through visual observation that the piezoelectric material layer had been formed without a gap and adhesion was favorable. When the hardness was increased further, the film deposition speed dropped further.

It was confirmed that, by making the Vickers hardness Hv (b) of the substrate in the film-deposition permitting region in the range 130 to 770 as described hereinabove, that is, by making the ratio between the Vickers hardness Hv (b) of the surface of the substrate on the side where particles adhere and the compressive breaking strength Gv (p) of the particles in unit of GPa in the range $0.10 \leqq Gv\ (p)/Hv\ (b) \times 100 \leqq 3.08$, growth of the film may be reliably expected. More particularly within this range, it was clear that it was preferable if, by making the Vickers hardness Hv (b) of the substrate in the film-deposition permitting region in the range 280 to 700, that is, by making the ratio between the Vickers hardness Hv (b) of the adhesion surface of the substrate to which particles adhere and the compressive breaking strength Gv (p) of the particles in unit of GPa in the range $0.11 \leqq Gv\ (p)/Hv\ (b) \times 100 \leqq 1.43$, a piezoelectric film that adequately satisfies the adhesion is reliably formed in a short time. In addition, it was found that it is possible to implement a fabrication method for the piezoelectric film in which the film deposition speed at which the piezoelectric film is formed is stable at high speeds and that is also superior from the perspective of productivity and fabrication costs (material costs of the particles) by establishing the Vickers hardness Hv (b) of the substrate in the range 290 to 440, that is, in the range $0.18 \leqq Gv(p)/Hv(b) \times 100 \leqq 1.38$.

As detailed above, according to this embodiment, by providing the substrate 26 with a film-deposition permitting regions A to which particles of a piezoelectric material in the carrier gas adhere to form films and a film-deposition inhibiting region B in which the formation of a film is inhibited, the piezoelectric material layers 27 are formed as a result of the adhesion of the particles to the film-deposition permitting regions A when the carrier gas is ejected. As a result, the piezoelectric material layers 27 can be formed easily in partial regions of the surface of the substrate 26. Therefore, the production of chips and cracks and so forth in the piezoelectric material layer is prevented because the piezoelectric material layer is completed without splitting as per the prior art.

The film-deposition permitting regions A and the film-deposition inhibiting region B are made different by changing the mutual surface hardness. That is, when a carrier gas containing particles of the piezoelectric material is ejected onto the substrate 26, the film-deposition permitting regions A are afforded a hardness that allows the particles to readily adhere to form films and film-deposition inhibiting region B is afforded a hardness that makes it difficult for the particles to form a film through adhesion. Therefore, the piezoelectric material layers 27 can be formed selectively in the film-deposition permitting regions A.

Further, because the value of the ratio between the Vickers hardness Hv (b) of the film-deposition permitting region A and the Vickers hardness Hv (p) of the particles is in the range $0.39 \leqq Hv\ (p)/Hv\ (b) \leqq 3.08$ and the ratio between the Vickers hardness Hv (b) of the film-deposition inhibiting region B and the Vickers hardness Hv (p) of the particles is afforded a value less than 0.39 or more than 3.08, the film deposition properties of the piezoelectric material layers 27 on the film-deposition permitting regions A can be ensured and film-deposition inhibition can be reliably implemented so that the piezoelectric material layer 27 is not deposited on the film-deposition inhibiting region B.

Further, because the value of the ratio between the Vickers hardness Hv (b) of the film-deposition permitting region A and the Vickers hardness Hv (p) of the particles is in the range $0.43 \leqq Hv\ (p)/Hv\ (b) \leqq 1.43$ and the ratio between the Vickers hardness Hv (b) of the film-deposition inhibiting region B and the Vickers hardness Hv (p) of the particles is afforded a value less than 0.39 or more than 3.08, the piezoelectric material layers 27 can be efficiently formed in the film-deposition permitting regions A and film-deposition inhibition can be reliably implemented so that the piezoelectric material layer 27 is not formed on the film-deposition inhibiting region B.

Further, because the value of the ratio between the Vickers hardness Hv (b) of the film-deposition permitting region A and the Vickers hardness Hv (p) of the particles is in the range $0.43 \leqq Hv\ (p)/Hv\ (b) \leqq 1.43$ and the ratio between the Vickers hardness Hv (b) of the film-deposition inhibiting region B and the Vickers hardness Hv (p) of the particles is afforded a value less than 0.43 or exceeding 1.43, layers that are thicker than the piezoelectric material layer 27 that is formed on the film-deposition inhibiting region B can be efficiently formed on the film-deposition permitting region A. Further, in this case, because a thin film is also formed on the film-deposition inhibiting region B, processing to remove this film is desirably performed.

Further, because the value of the ratio between the Vickers hardness Hv (b) of the film-deposition permitting region A and the compressive breaking strength Gv (p) of the particles in unit of GPa is in the range $0.10 \leqq Gv\ (p)/Hv\ (b) \times 100 \leqq 3.08$ and the ratio between the Vickers hardness Hv (b) of the film-deposition inhibiting region B and the compressive breaking strength Gv (p) of the particles in unit of GPa is afforded a value less than 0.10 or more than 3.08, the film deposition properties of the piezoelectric material layers 27 in the film-deposition permitting regions A can be ensured and film-deposition inhibition can be reliably implemented so that the piezoelectric material layer 27 is not deposited on the film-deposition inhibiting region B.

Further, because the value of the ratio between the Vickers hardness Hv (b) of the film-deposition permitting region A and the compressive breaking strength Gv (p) of the particles in unit of GPa is in the range $0.11 \leqq Gv\ (p)/Hv\ (b) \times 100 \leqq 1.43$ and the ratio between the Vickers hardness Hv (b) of the film-deposition inhibiting region B and the compressive breaking strength Gv (p) of the particles in unit of GPa is afforded a value less than 0.10 or more than 3.08, the piezoelectric material layers 27 can be efficiently formed in the film-deposition permitting regions A and film-deposition inhibition can be reliably implemented so that the piezoelectric material layer 27 is not formed on the film-deposition inhibiting region B.

Further, because the value of the ratio between the Vickers hardness Hv (b) of the film-deposition permitting region A and the compressive breaking strength Gv (p) of the particles in unit of GPa is in the range $0.11 \leqq Gv\ (p)/Hv\ (b) \times 100 \leqq 1.43$ and the ratio between the Vickers hardness Hv (b) of the film-deposition inhibiting region B and the compressive breaking strength Gv (p) of the particles in unit of GPa is afforded a value less than 0.11 or exceeding 1.43, layers that are thicker than the piezoelectric material layer 27 that is formed on the film-deposition inhibiting region B can be efficiently formed on the film-deposition permitting region A. Further, in this case, because a thin film is also formed on the film-deposition inhibiting region B, processing to remove this film is desirably performed.

In addition, the film-deposition permitting regions A and the film-deposition inhibiting region B are made different by affording the substrate 26, which is exposed at the film-deposition permitting regions A, such a hardness that, when a carrier gas containing particles of a piezoelectric material is ejected, the particles readily adhere to form films and affording the different hardness material layer 28 constituting deposition-inhibiting region B such a hardness that it is difficult for the particles to adhere to form a film.

In addition, because the different hardness material layer 28 has an insulating property, the same also functions as an insulating layer, which makes electrical wiring straightforward.

Furthermore, because the individual electrodes 30 for applying an electric field are formed the piezoelectric material layers 27 respectively each of the piezoelectric material layers 27 can be individually driven.

Further, by forming the lead portions 31, which are connected to the individual electrodes 30, on the upper surface of the insulating different hardness material layer 28, the different hardness material layer 28 also serves as an insulating layer for the electric wiring and, in comparison with a case where an insulating layer is formed separately, the structure and fabrication steps are simple and costs can be reduced.

In addition, the substrate 26 is formed by means of a conductive material and, by using the same as one electrode for applying an electric field to the piezoelectric material layers 27, it is not necessary to especially provide one electrode, which is advantageous from a fabrication cost standpoint.

Second Embodiment

Figure 7:
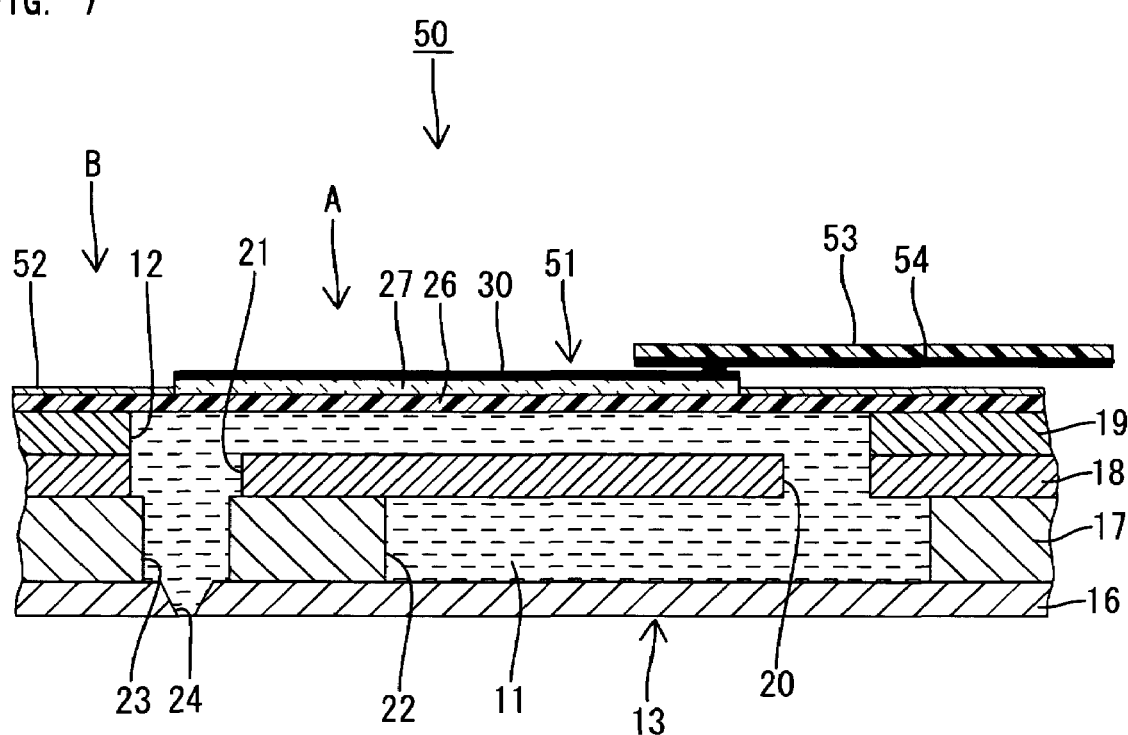
FIG. 7 is a cross-sectional view in which the inkjet head of a second embodiment is sectioned in the length direction of the pressure chamber.
Figure 8:
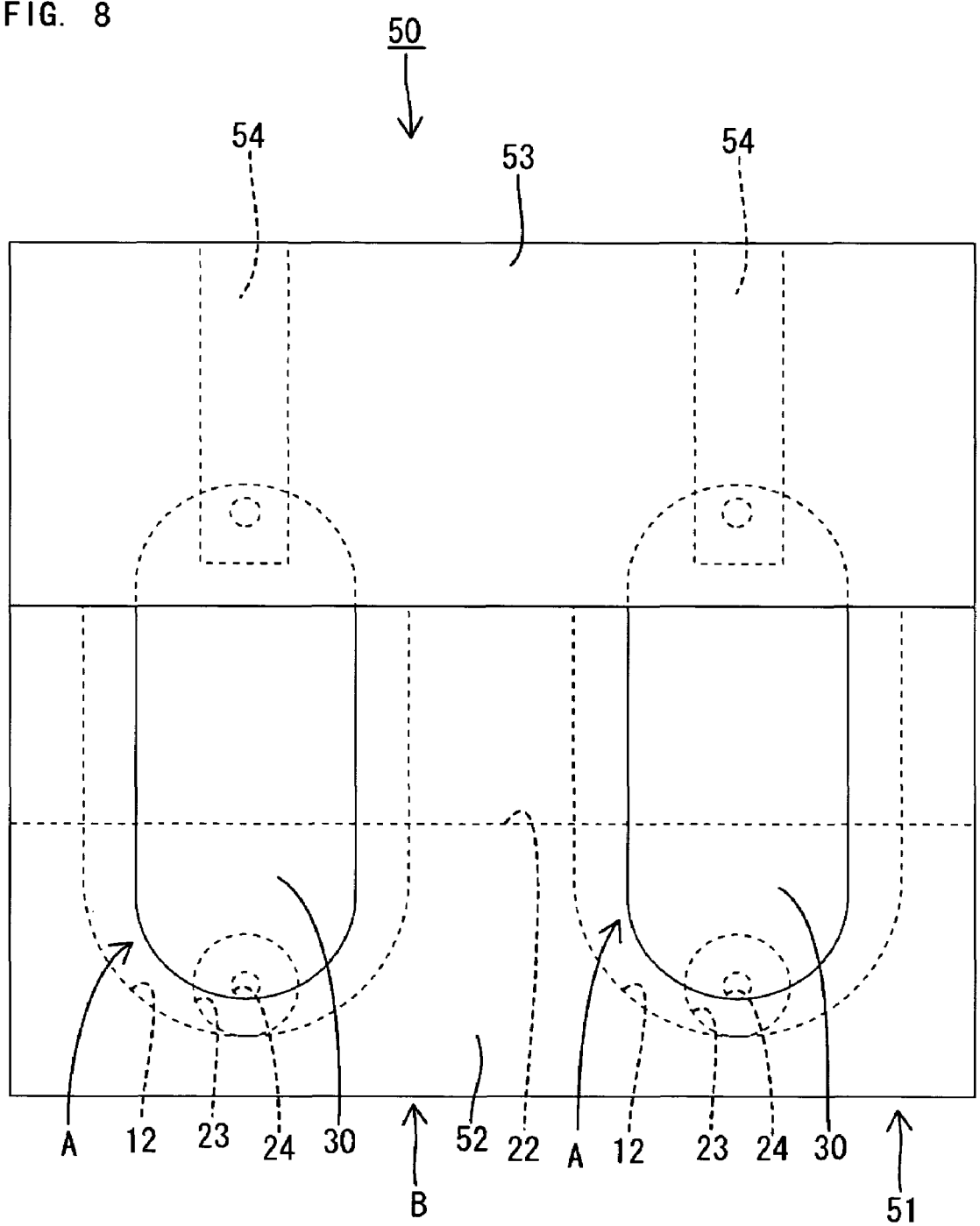
FIG. 8 is a planar view of the inkjet head.
Figure 9:
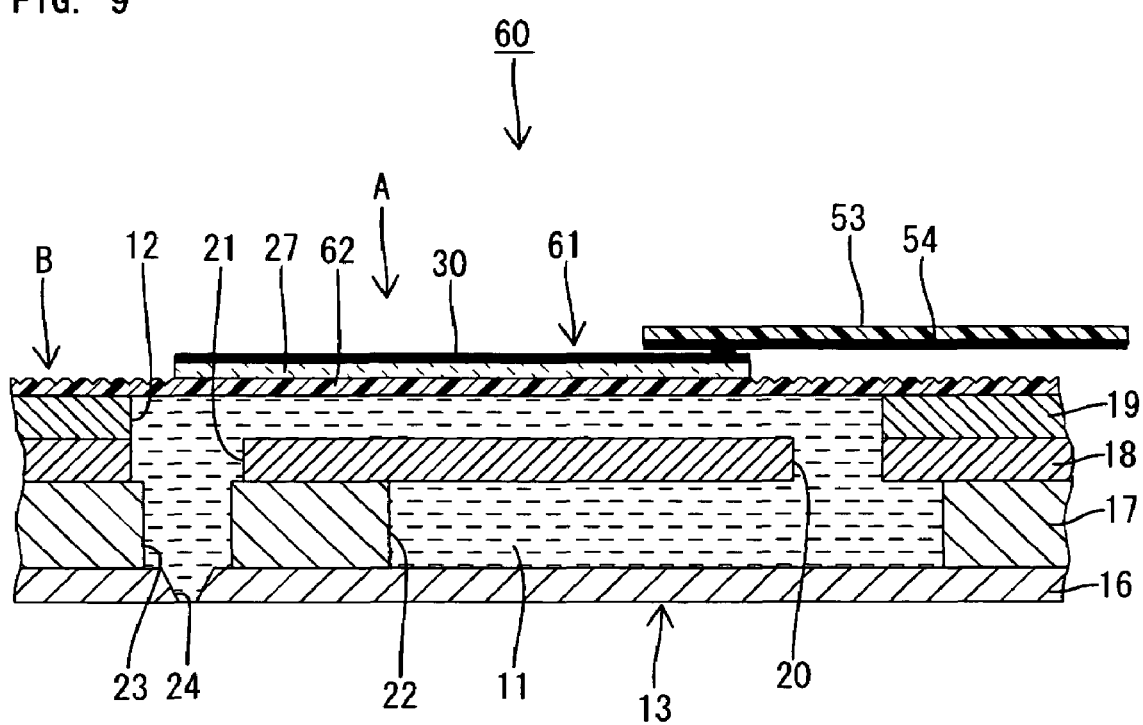
FIG. 9 is a cross-sectional view in which the inkjet head of a third embodiment is sectioned in the length direction of the pressure chamber.

The second embodiment of the present invention will be described below with reference to FIGS. 7 and 8. Further, in the following description, the same reference numerals have been assigned to the constituent parts that are the same as those of the first embodiment and a description thereof is omitted here.

In the inkjet head 50 of the present embodiment, a different hardness material layer 52, constituting the film-deposition inhibiting region B on the substrate 26 of the actuator unit 51, is conductive. As a result, one ends of conductive paths 54 of a flat cable 53, which is connected to the driver circuit (not shown), is connected to individual electrodes 30, which are formed on the upper surface of each piezoelectric material layers 27 instead of being connected to the lead portions 31 of the first embodiment. The remaining structure is substantially similar to that of the first embodiment.

The substrate 26 is formed from a material that is the same as that mentioned in the first embodiment, i.e. a metallic material with such a hardness that particles readily adhere to form films when a carrier gas containing particles of a piezoelectric material are ejected in the piezoelectric layer formation step. Stainless steel of Hv 450 to 600, or similar, is used, for example.

Further, the different hardness material layer 52 is conductive and a material of a different hardness to that of the substrate 26 and, is afforded such a hardness that, in the piezoelectric layer formation step, particles do not readily adhere to form a film in comparison with the substrate 26 when a carrier gas containing particles of a piezoelectric material are ejected.

Aluminum with a Vickers hardness of substantially Hv 80, for example, may be used as a conductive material with a lower hardness than the substrate 26. Further, hard chrome plating with a Vickers hardness of substantially Hv 1000, for example or similar may be used as a conductive material that is harder than the substrate 26.

The structure of the inkjet head 50 of this embodiment can also be implemented by means of roughly the same procedure as that for the inkjet head 10 of the first embodiment.

Third Embodiment

The third embodiment of the present invention will be described below with reference to FIGS. 9 and 10A, 10B, 10C and 10D. Further, in the following description, the same reference numerals have been assigned to the constituent parts that are the same as those of the first embodiment and a description thereof is omitted here.

In the case of the inkjet head 60 of this embodiment, the roughness of the surface of the film-deposition inhibiting region B where the piezoelectric material layer 27 is not formed on the surface of a substrate 62 of an actuator unit 61 is made larger than the surface roughness of the film-deposition permitting regions A where the piezoelectric material layers 27 are formed. That is, in this embodiment, the film-deposition permitting regions A and the film-deposition inhibiting region B are made different by changing the mutual surface roughness. The film-deposition permitting regions A are afforded such a surface roughness that, in the piezoelectric layer formation step, particles readily adhere to form films when a carrier gas containing particles of the piezoelectric material is ejected and the film-deposition inhibiting region B is afforded such a surface roughness that it is difficult for the particles to adhere to form a film when the carrier gas is ejected, this surface roughness being larger than that of the film-deposition permitting regions A.

In the film deposition region formation step, the substrate 62, which is fixed to the upper surface of the ink flow path formation member 13 in the substrate fixation step, is prepared. The same material as that mentioned in the first embodiment can be used for substrate 62. For example, stainless steel with a Vickers hardness of Hv 450 to 600, or similar, may be used. In addition, the surface roughness is reduced adequately over the whole area of the upper surface of the substrate 62 (Ra: 1 μm or less, for example; Ra refers to arithmetic average roughness prescribed by Japanese Industrial Standards). Further, resists 63 are formed through patterning in regions that corresponds to the film-deposition permitting regions A on the upper surface of the substrate 62 (See FIG. 10A). Thereafter, the substrate 62 undergoes etching to roughen the surface thereof (See FIG. 10B) and the roughness of the surface of the region without the resist 63 of the surface of the substrate 62 is increased (Ra: 2 μm or more, for example; Ra refers to arithmetic average roughness prescribed by Japanese Industrial Standards). Thereafter, the resists 63 are removed (See FIG. 10C). As a result, the film-deposition permitting regions A with a small surface roughness and the film-deposition inhibiting region B with a large surface roughness are formed as patterns on the surface of the substrate 62.

Further, this step may be performed as follows, for example. A die, which is patterned so that the surface roughness of the region that corresponds to the film-deposition inhibiting region B is large and the surface roughness of the regions corresponding to the film-deposition permitting regions are small is created beforehand and, by pressing the die onto the surface of the substrate 62 in a state where the surface roughness is small over the whole area thereof, processing is implemented to increase the surface roughness of the region corresponding to the film-deposition inhibiting region B.

Figure 10:
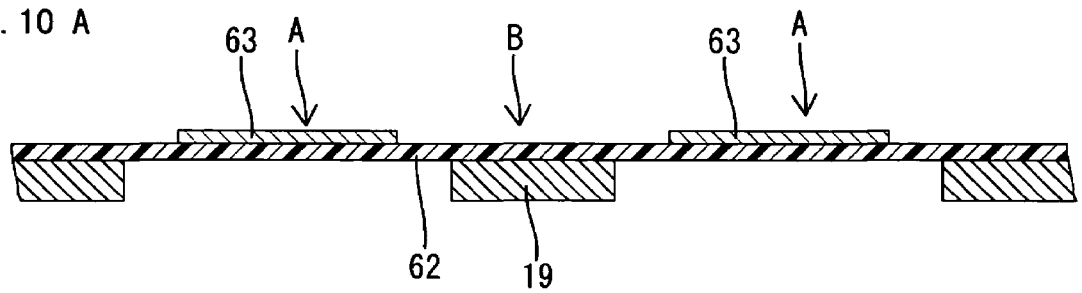
FIG. 10A is a cross-sectional view of when a resist is formed through patterning on the substrate.
FIG. 10B is a cross-sectional view of when etching is performed.
FIG. 10C is a cross-sectional view of when the resist is removed from the substrate.
FIG. 10D is a cross-sectional view of when a carrier gas containing particles of a piezoelectric material is ejected onto the substrate.
Figure 10:
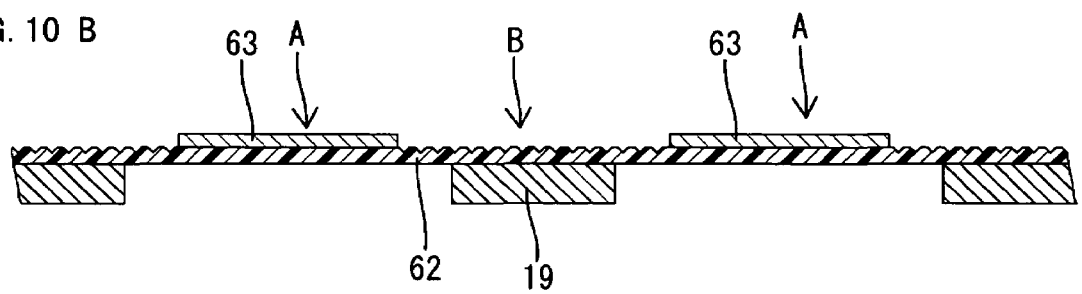
Figure 10:
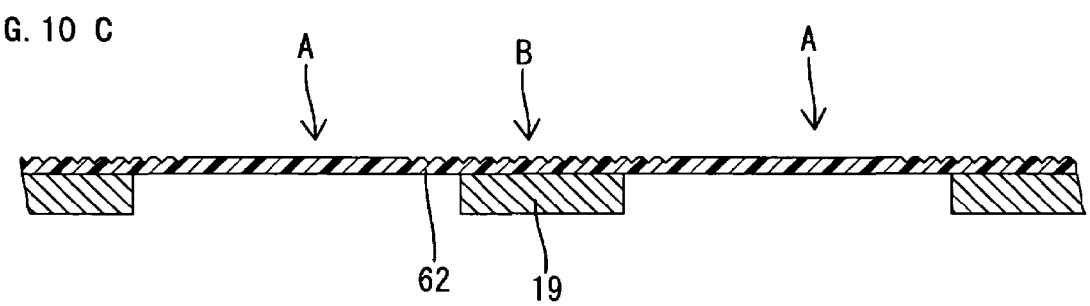
Figure 10:
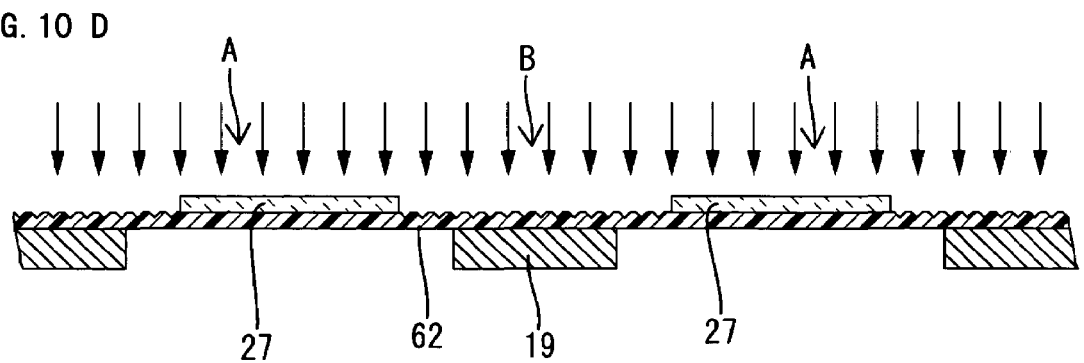

Thereafter, when a carrier gas containing particles of a piezoelectric material is ejected onto the surface of the substrate 62 in the piezoelectric layer formation step, the particles are favorably deposited and adheres to the film-deposition permitting regions A with a small surface roughness (See FIG. 10D). On the other hand, on the film-deposition inhibiting region B with a large surface roughness, because the particles only adhere a little and do not form a film or, even when a film results, only a very thin film is formed in comparison with the film-deposition permitting regions A, peeling can easily take place thereafter.

According to this embodiment, by adjusting the surface roughness of the substrate 62 to afford the film-deposition permitting regions A such a surface roughness that particles of a piezoelectric material in a carrier gas readily adhere to form films and to afford the film-deposition inhibiting region B such a surface roughness that it is difficult for the particles to adhere to form a film, the piezoelectric material layers 27 can be selectively formed in the film-deposition permitting regions A.

Fourth Embodiment

The fourth embodiment of the present invention will be described next with reference to FIGS. 11A to 11C. Further, in the following description, the same reference numerals have been assigned to the constituent parts that are the same as those of the above embodiments and a description thereof is omitted here.

In the inkjet head (not shown) of this embodiment, a buffer fluid layer 70 is provided to constitute the film-deposition inhibiting region B on the upper surface of substrate 26. The buffer fluid layer 70 is a layer that serves to inhibit the adhesion of the particles in the form of a film by reducing the collision speed of the particles of piezoelectric material in the carrier gas in the piezoelectric layer formation step. A nonvolatile, highly viscous fluid may be used as the buffer fluid layer 70. An oily fluid such as silicon oil or soybean oil may be used, for example. Because the buffer fluid layer 70 is a nonvolatile fluid, the same does not readily become volatile in a state of low pressure within the film deposition chamber 42 in the piezoelectric layer formation step. Further, because the buffer fluid layer 70 comprises a fluid of high viscosity, the same does not readily flow on the substrate 26, whereby pattern stability is favorable.

Figure 11:
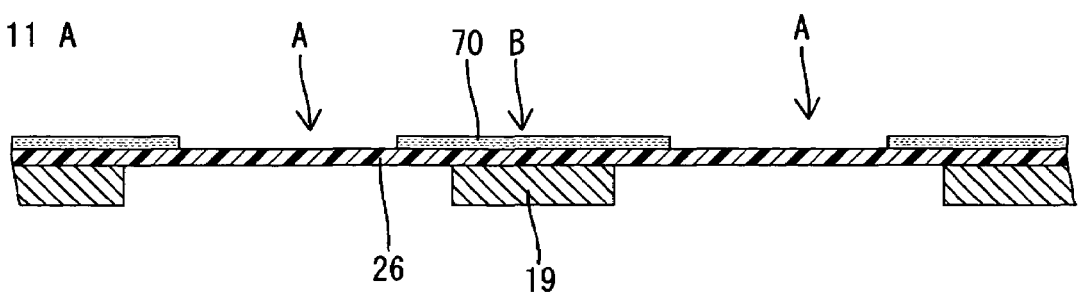
FIG. 11A is a cross-sectional view of when a buffer fluid layer is coated on the substrate according to a fourth embodiment.
FIG. 11B is a cross-sectional view of when a carrier gas containing particles of a piezoelectric material is ejected onto the substrate according to a fourth embodiment.
FIG. 11C is a cross-sectional view of when an individual electrode is formed on the upper surface of a piezoelectric material layer according to a fourth embodiment.
Figure 11:
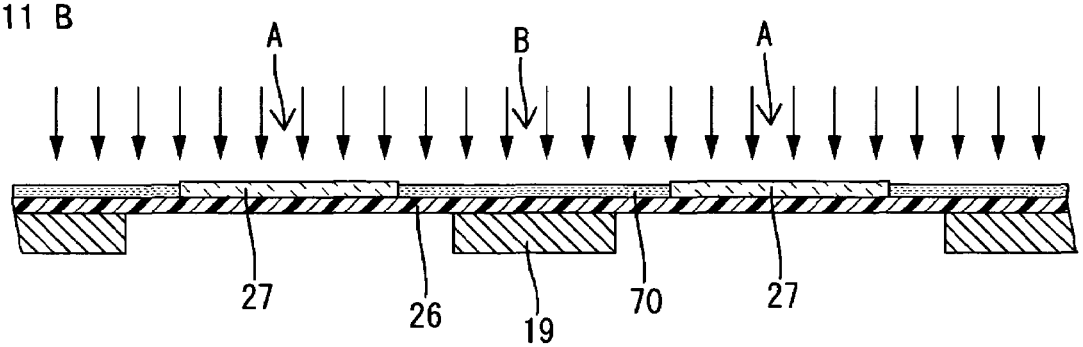
Figure 11:
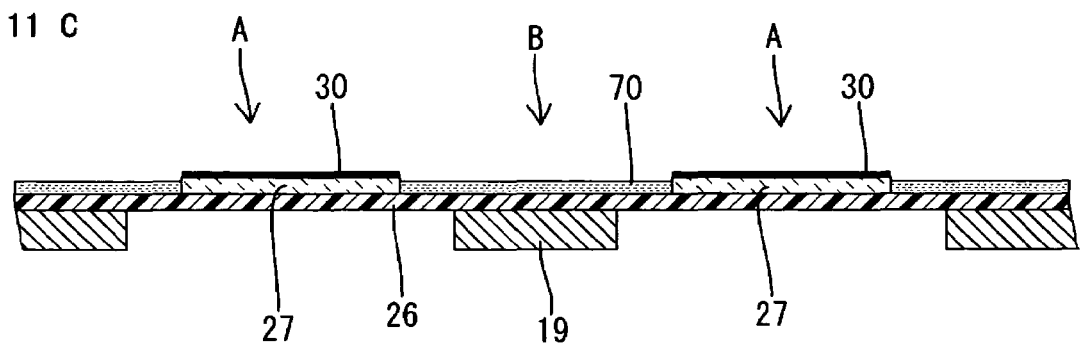

The buffer fluid layer 70 is formed to constitute the film-deposition inhibiting region B by coating the fluid on the surface of the substrate 26 in the form of a pattern by means of the transfer method or inkjet method (See FIG. 11A). Further, the same material as that mentioned in the first embodiment can be used for the substrate 26. For example, stainless steel with a Vickers hardness of Hv 450 to 600, or similar, may be used.

Thereafter, when a carrier gas containing particles of the piezoelectric material is ejected onto the surface of the substrate 26 in the piezoelectric layer formation step, the particles collide directly with the surface of the exposed parts of the substrate 26 constituting the film-deposition permitting regions A. Here, because the particles collide with sufficient speed, the particles adhere to and are deposited on the surface of the substrate 26, whereby a film-like piezoelectric material layers 27 are formed (See FIG. 11B). On the other hand, when particles in the carrier gas collide with the buffer fluid layer 70 constituting the film-deposition inhibiting region B, same under deceleration and, when these particles reach the surface of the substrate 26, because the speed energy required for adhesion as a film is lost, a film is not formed.

Thereafter, in the individual electrode formation step, individual electrodes 30 are formed on the surface of the piezoelectric material layers 27 as shown in FIG. 1C, and the conductive paths 54 of the flat cable 53 are connected to the individual electrodes 30.

According to this embodiment, when particles in a carrier gas collide with the buffer fluid layers 70 constituting the film-deposition inhibiting region B, the speed of the particles is reduced and the speed energy required for adhesion as a film is lost, meaning that a film is not formed.

In addition, because the buffer fluid layer 70 comprises a nonvolatile fluid, it is difficult for volatilization to occur even when the pressure is reduced in the film deposition chamber 42 in the piezoelectric layer formation step.

Other Embodiments

The present invention is not limited to or by the embodiments mentioned above and described with reference to the drawings. For example, the following embodiments are also included in the technological scope of the present invention and, in addition to the following embodiments, a variety of modifications can be implemented within the technological scope without departing from the spirit of the present invention. (1) According to the present invention, the relationships of correspondence between the substrate and the different hardness material layer, and as well as the surface hardness thereof in the first and second embodiments may be the opposite. That is, a material with such a surface hardness that, when a carrier gas that contains particles of a piezoelectric material is ejected, the particles do not readily adhere to form a film, such as alumina or zirconia with a large surface hardness, for example, is used for the substrate and a material with such a surface hardness that the particles readily adhere to form a film, such as stainless steel, gold, or nickel with a lower surface hardness than the substrate, for example, is used as the different hardness material layer. Further, in the film deposition region formation step, the different hardness material layers are provided to constitute the film-deposition permitting regions A on the substrate surface and the substrate surface is exposed as the film-deposition inhibiting region. The piezoelectric material layers can also be formed selectively on the film-deposition permitting regions A in the case of such a constitution.

(2) Although a piezoelectric actuator that is used as an inkjet head is illustrated in each of the above embodiments, the present invention can also be applied to a piezoelectric actuator other than for an inkjet head such as a micropump that conveys fluid by using a piezoelectric material layer, for example, and to a fabrication method thereof.

The entire disclosure of the specification, claims, summary and drawings of Japanese Patent Application No. 2004-100239 filed on Mar. 30, 2004 is hereby incorporated by reference.

What is claimed is:

1. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein:

in forming the film deposition region, the film-deposition permitting region and the film-deposition inhibiting region are made different by changing the mutual surface hardness, and the value of the ratio between the Vickers hardness Hv (b) of the film-deposititition permitting region and the Vickers hardness Hv (p) of the particles is in the range $0.39 \leq Hv(p)/Hv(b) \leq 3.08$ and the ratio between the Vickers hardness Hv (b) of the film-deposition inhibiting region and the Vickers hardness Hv (p) of the particles is a value less than 0.39 or exceeding 3.08.

2. The piezoelectric actuator fabrication method according to claim 1, wherein the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.39 or more than 3.08.

3. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein:

in forming the film deposition region, the film-deposition permitting region and the film-deposition inhibiting region are made different by changing the mutual surface hardness, and the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.43 or exceeding 1.43.

4. The piezoelectric actuator fabrication method according to claim 3, wherein the value of the ratio between the Vickers hardness Hv (b) of the film-deposition permitting region and the Vickers hardness Hv (p) of the particles is in the range $0.43 \leq Hv(p)/Hv(b) \leq 1.43$ and the ratio between the Vickers hardness Hv (b) of the film-deposition inhibiting region and the Vickers hardness Hv (p) of the particles is a value less than 0.39 or more than 3.08.

5. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein:

in forming the film deposition region, the film-deposition permitting region and the film-deposition inhibiting region are made different by changing the mutual surface hardness, and in forming the film deposition region, by forming a different hardness material layer with a different surface hardness from that of the substrate on the one surface of the substrate by means of patterning, the film-deposition permitting region constituted by an exposed region of the one surface of the substrate and the film-deposition inhibiting region constituted by the different hardness material layer are provided.

6. The piezoelectric actuator fabrication method according to claim 5, wherein the different hardness material layer possesses an insulating property.

7. The piezoelectric actuator fabrication method according to claim 6, further comprising, following forming the piezoelectric layer:

forming an individual electrode for applying an electric field to the piezoelectric material layer on the piezoelectric material layer, wherein, in forming the electrode, a lead portion that is electrically connected to the individual electrode is formed on the different hardness material layer.

8. The piezoelectric actuator fabrication method according to claim 5, further comprising, forming an individual electrode for applying an electric field to the piezoelectric material layer on the piezoelectric material layer after forming the piezoelectric layer.

9. The piezoelectric actuator fabrication method according to claim 5, wherein the substrate is made of a material that possesses conductivity and is used as one electrode for applying an electric field to the piezoelectric material layer.

10. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein, in forming the film deposition region, by performing surface processing to adjust the surface roughness of the one surface of the substrate, a region of low surface-roughness constituting the film-deposition permitting region and a region of high surface-roughness constituting the film-deposition inhibiting region are provided.

11. The piezoelectric actuator fabrication method according to claim 10, further comprising, forming an individual electrode for applying an electric field to the piezoelectric material layer on the piezoelectric material layer after forming the piezoelectric layer.

12. The piezoelectric actuator fabrication method according to claim 10, wherein the substrate is made of a material that possesses conductivity and is used as one electrode for applying an electric field to the piezoelectric material layer.

13. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein, in forming the film deposition region, a buffer fluid layer for inhibiting the adhesion of the particles in the form of a film by reducing the collision speed of the particles in the piezoelectric material in the carrier gas is provided, constituting the film-deposition inhibiting region on the one surface of the substrate.

14. The piezoelectric actuator fabrication method according to claim 13, wherein the buffer fluid layer comprising a fluid that is nonvolatile.

15. The piezoelectric actuator fabrication method according to claim 13, further comprising, forming an individual electrode for applying an electric field to the piezoelectric material layer on the piezoelectric material layer after forming the piezoelectric layer.

16. The piezoelectric actuator fabrication method according to claim 13, wherein the substrate is made of a material that possesses conductivity and is used as one electrode for applying an electric field to the piezoelectric material layer.

17. A piezoelectric actuator in which a piezoelectric material layer is formed by ejecting a carrier gas containing particles of a piezoelectric material onto one surface of a substrate to cause the particles to adhere to the one surface of the substrate, wherein:

a film-deposition permitting region to which particles of the piezoelectric material in the carrier gas adhere in a form of a film and a film-deposition inhibiting region which inhibits the adhesion of the particles in a form of a film are provided on one surface of the substrate, the piezoelectric material layer is formed on the film-deposition permitting region, the film-deposition permitting region and the film-deposition inhibiting region are made different by forming a different hardness material layer that possesses a different surface hardness from that of the substrate on one surface of the substrate, the different hardness material layer possesses insulating properties, and the film-deposition inhibiting region is constituted by the different hardness material layer that is harder than the substrate.

18. The piezoelectric actuator according to claim 17, wherein a lead portion that is connected electrically to the individual electrode is formed on the different hardness material layer.

19. The piezoelectric actuator according claim 17, wherein an individual electrode for applying an electric field to the piezoelectric material layer is formed on the piezoelectric material layer.

20. The piezoelectric actuator according claim 17, wherein the substrate is made of a material that possesses conductivity and is used as a common electrode for applying an electric field to the piezoelectric material layer.

21. A piezoelectric actuator in which a piezoelectric material layer is formed by ejecting a carrier gas containing particles of a piezoelectric material onto one surface of a substrate to cause the particles to adhere to the one surface of the substrate, wherein:

a film-deposition permitting region to which particles of the piezoelectric material in the carrier gas adhere in a form of a film and a film-deposition inhibiting region which inhibits the adhesion of the particles in a form of a film are provided on one surface of the substrate, the piezoelectric material layer is formed on the film-deposition permitting region, and the film-deposition inhibiting region is made different from the film-deposition permitting region by increasing the surface roughness of the substrate in comparison with that of the film-deposition permitting region.

22. The piezoelectric actuator according claim 21, wherein the substrate is made of a material that possesses conductivity and is used as a common electrode for applying an electric field to the piezoelectric material layer.

23. The piezoelectric actuator according claim 21, wherein an individual electrode for applying an electric field to the piezoelectric material layer is formed on the piezoelectric material layer.

24. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein:

in forming the film region, the film-deposition permitting region and the film-deposition inhibiting region are made different by changing the mutual surface hardness, and the value of the ratio between the Vickers hardness Hv (b) of the film-deposition permitting region and the compressive breaking strength Gv (p) of the particles in unit of GPa is in the range $0.10 \leq Gv\,(p)/Hv\,(b) \times 100 \leq 3.08$ and the ratio between the Vickers hardness Hv (b) of the film-deposition inhibiting region and the compressive breaking strength Gv (p) of the particles in unit of GPa is a value less than 0.10 or exceeding 3.08.

25. The piezoelectric actuator fabrication method according to claim 24, wherein the value of the ratio between the Vickers hardness Hv (b) of the film-deposition permitting region and the compressive breaking strength Gv (p) of the particles in unit of GPa is in the range $0.11 \leq Gv(p)/Hv\,(b) \times 100 \leq 1.43$ and the ratio between the Vickers hardness Hv (b) of the film-deposition inhibiting region and the compressive breaking strength Gv (p) of the particles in unit of GPa is a value less than 0.10 or more than 3.08.

26. A piezoelectric actuator fabrication method in which a piezoelectric material layer is formed by ejecting a carrier gas containing particles of a piezoelectric material onto one surface of a substrate to cause the particles to adhere to the one surface of the substrate, comprising:

providing on the one surface of the substrate, a film-deposition permitting region to which the particles adhere until a film is formed when the carrier gas is ejected onto the one surface of the substrate and a film-deposition inhibiting region which inhibits the adhesion of the particles in a form of a film thereto; and forming the piezoelectric material layer on the film-deposition permitting region by ejecting the carrier gas containing the particles onto the one surface of the substrate that has undergone the film deposition region formation, wherein:

in forming the film deposition region, the film-deposition permitting region and the film-deposition inhibiting region are made different by changing the mutual surface hardness, and the value of the ratio between the Vickers hardness Hv (b) of the film-deposition permitting region and the compressive breaking strength Gv (p) of the particles in unit of GPa is in the range $0.11 \leqq Gv\ (p)/Hv\ (b) \times 100 \leqq 1.43$ and the ratio between the Vickers hardness Hv (b) of the film-deposition inhibiting region and the compressive breaking strength Gv (p) of the particles in unit of GPa is a value less than 0.11 or exceeding 1.43.

27. The piezoelectric actuator fabrication method according to claim 26, wherein the value of the ratio between the Vickers hardness Hv (b) of the film-deposition permitting region and the compressive breaking strength Gv (p) of the particles in unit of GPa is in the range $0.11 \leqq Gv\ (p)/HV\ (b) \times 100 \leqq 1.43$ and the ratio between the Vickers hardness HV (b) of the film-deposition inhibiting region and the compressive breaking strength Gv(p) of the particles in unit of GPa is a value less than 0.10 or more than 3.08.

* * * * *